(12) United States Patent
Olarig et al.

(10) Patent No.: US 11,018,444 B2
(45) Date of Patent: May 25, 2021

(54) MULTI-MODE AND/OR MULTI-SPEED NON-VOLATILE MEMORY (NVM) EXPRESS (NVME) OVER FABRICS (NVME-OF) DEVICE

(71) Applicant: Samsung Electronics Co., Ltd., Suwon-si (KR)

(72) Inventors: Sompong Paul Olarig, Pleasanton, CA (US); Fred Worley, San Jose, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 146 days.

(21) Appl. No.: 16/033,141

(22) Filed: Jul. 11, 2018

(65) Prior Publication Data

US 2019/0280411 A1 Sep. 12, 2019

Related U.S. Application Data

(60) Provisional application No. 62/641,250, filed on Mar. 9, 2018.

(51) Int. Cl.
*H05K 1/18* (2006.01)
*H05K 3/30* (2006.01)
*H01R 12/73* (2011.01)
*H01R 12/72* (2011.01)
(Continued)

(52) U.S. Cl.
CPC ......... *H01R 12/737* (2013.01); *H01R 12/721* (2013.01); *H01R 43/205* (2013.01); *H01R 43/26* (2013.01); *H05K 1/181* (2013.01); *H05K 3/303* (2013.01); *H05K 2201/10159* (2013.01); *H05K 2201/10189* (2013.01); *H05K 2201/10212* (2013.01); *H05K 2201/10522* (2013.01); *H05K 2201/10545* (2013.01)

(58) Field of Classification Search
CPC .. H01R 12/737; H01R 12/721; H01R 43/205; H01R 43/26; H05K 1/181; H05K 3/303; H05K 2201/10545; H05K 2201/10159; H05K 2201/10212; H05K 2201/10522; H05K 2201/10189; G06F 13/385; G06F 13/4022
See application file for complete search history.

(56) References Cited

U.S. PATENT DOCUMENTS 8,508,928 B2 8/2013 Killen et al.
2006/0258231 A1* 11/2006 Cox .................. H01R 4/38
439/798

(Continued)

OTHER PUBLICATIONS

SFF-TA-1008 Specification for Enterprise and Datacenter SSD 3 Form Factor; Revision 1.0 Mar. 30, 2018 (Year: 2018).*

*Primary Examiner* — Idriss N Alrobaye
*Assistant Examiner* — Ronald T Modo
(74) *Attorney, Agent, or Firm* — Lewis Roca Rothgerber Christie LLP

(57) ABSTRACT

In an example, a device includes: a printed circuit board (PCB); at least one solid state drive (SSD) connected at a first side of the PCB via at least one SSD connector; at least one field programmable gate array (FPGA) mounted on the PCB at a second side of the PCB; and at least one connector attached to the PCB at a third side of the PCB, wherein the device is configured to operate in a first speed from a plurality of operating speeds based on a first input received via the at least one connector.

20 Claims, 15 Drawing Sheets

(51) Int. Cl.
*H01R 43/20* (2006.01)
*H01R 43/26* (2006.01)

(56) References Cited

U.S. PATENT DOCUMENTS

| | | | |
|---|---|---|---|
| 2014/0372678 A1* | 12/2014 | Moon | G06F 12/0246 |
| | | | 711/103 |
| 2015/0019918 A1* | 1/2015 | Li | G06F 11/108 |
| | | | 714/54 |
| 2015/0277512 A1 | 10/2015 | Davis et al. | |
| 2015/0351277 A1* | 12/2015 | Frank | H05K 7/1402 |
| | | | 361/679.33 |
| 2016/0259754 A1 | 9/2016 | Ping | |
| 2017/0168943 A1 | 6/2017 | Chou et al. | |
| 2017/0220505 A1* | 8/2017 | Breakstone | G06F 11/2015 |
| 2019/0245924 A1* | 8/2019 | Li | G06F 3/067 |
| 2019/0342177 A1* | 11/2019 | Shah | H04L 41/0893 |

* cited by examiner

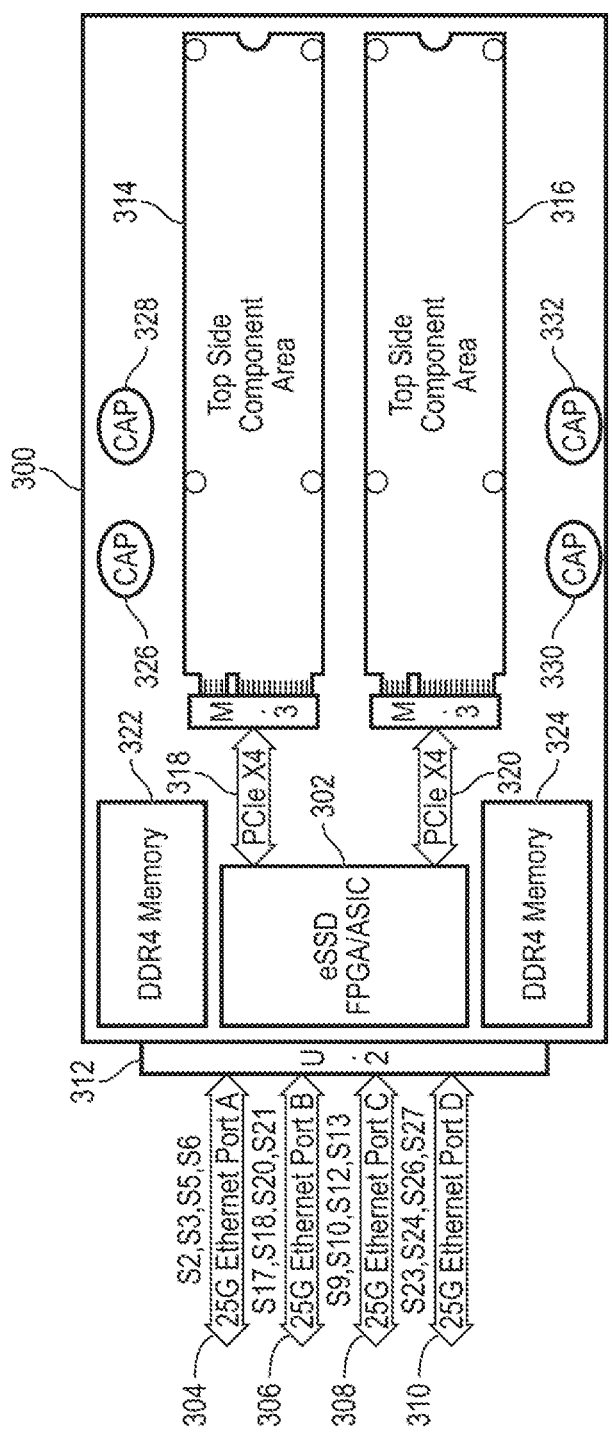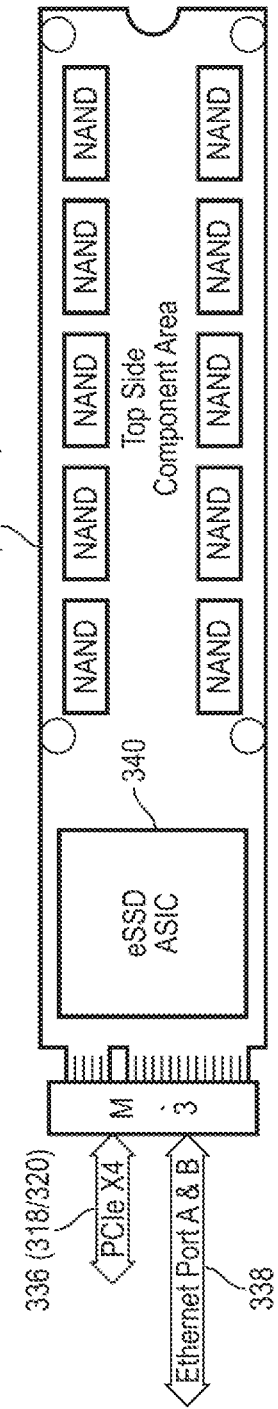
FIG. 3A
FIG. 3B

| Operation Mode | SAS0 | SAS1 | PCIe0 | PCIe1 | PCIe2 | PCIe3 | Chassis Type Pin E6 (lo=NVMe, hi=NVMe-oF) | DualPortEN# Pin E25 of U.2 |
|---|---|---|---|---|---|---|---|---|
| Ethernet Ports disabled Single Port NVMe | Not used | Not used | Used as single X4 | Used as single X4 | Used as single X4 | Used as single X4 | NVMe | high |
| Ethernet Ports disabled Dual Port NVMe | Not used | Not used | PCIe Port A | PCIe Port A | PCIe Port B | PCIe Port B | NVMe | Low |
| 10G (single and dual port) | Ethernet A | | Control Port A X1 | Ethernet B | | Control Port B X1 | NVMe-oF | High/Low |
| 25G (single and dual port) | Ethernet A | | Control Port A X1 | Ethernet B | | Control Port B X1 | NVMe-oF | High/Low |
| 50G (single and dual port) | Ethernet A | Ethernet C | Control Port A X1 | Ethernet B | Ethernet D | Control Port B X1 | NVMe-oF | High/Low |
| 100G (single port only) | Ethernet A | Ethernet C | Control Port A X1 | Ethernet B | Ethernet D | Control Port B X1 | NVMe-oF | High/Not supported |

*FIG. 5*

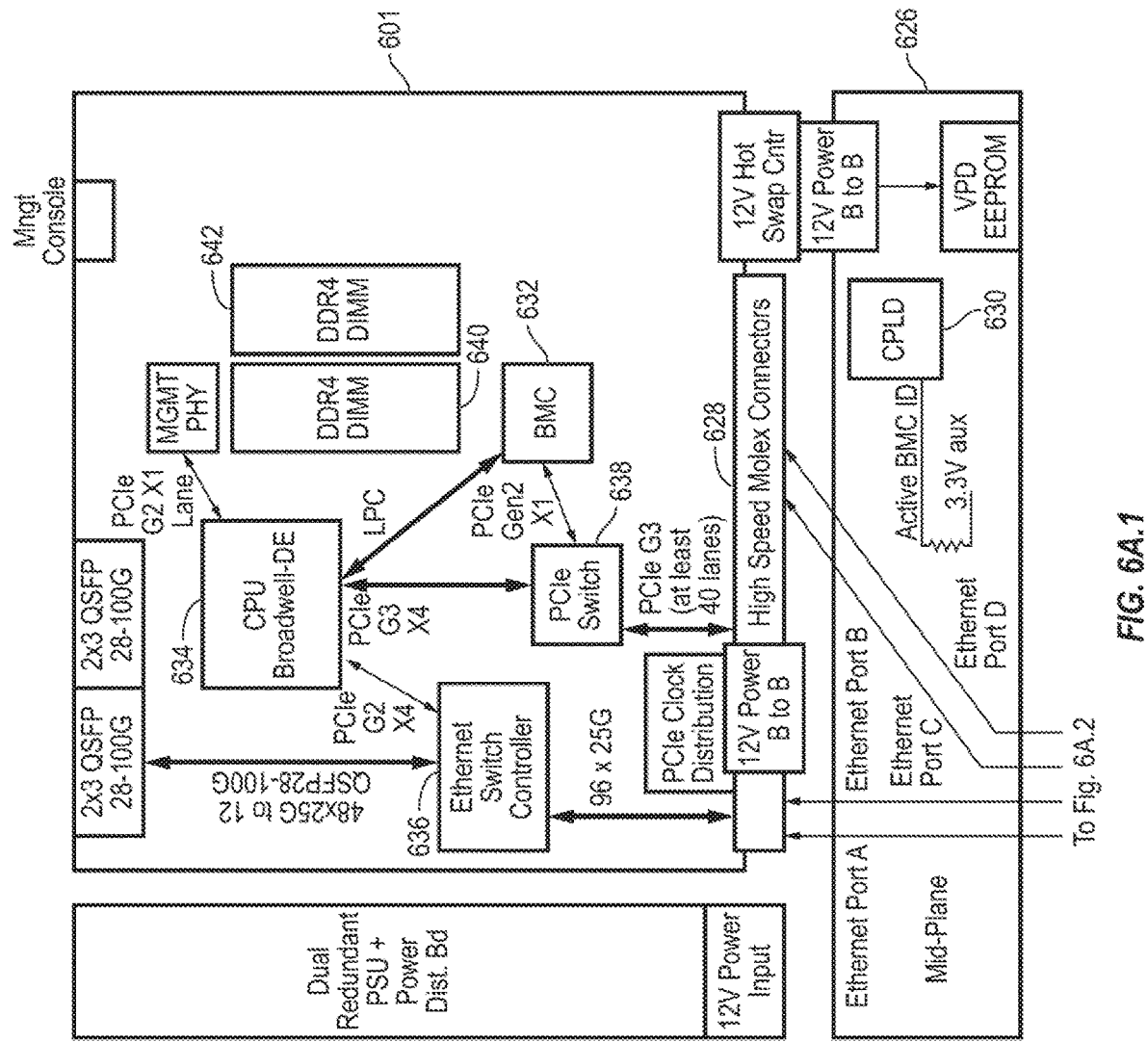
FIG. 6A.1

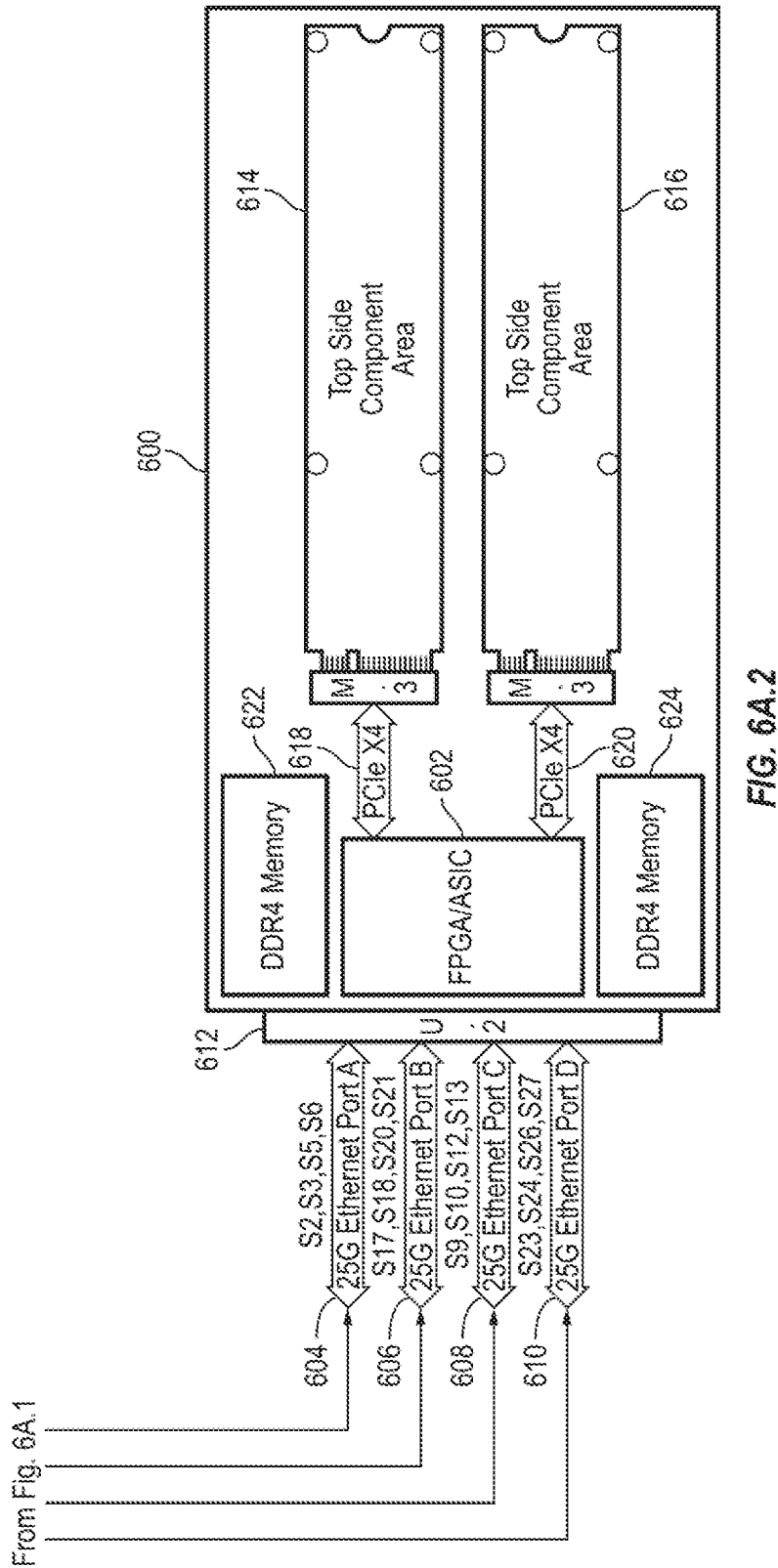
FIG. 6A.2

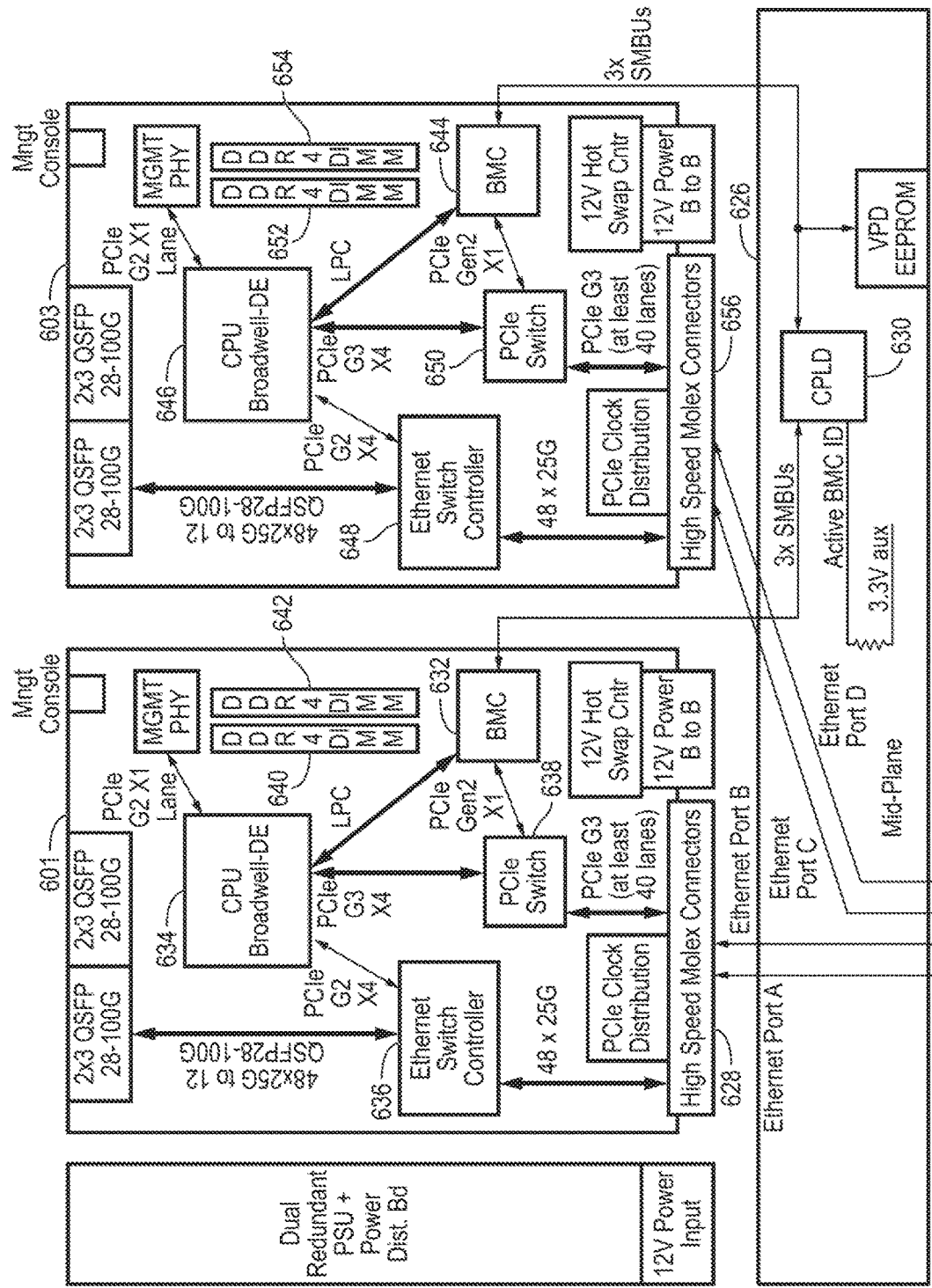
FIG. 6B.1

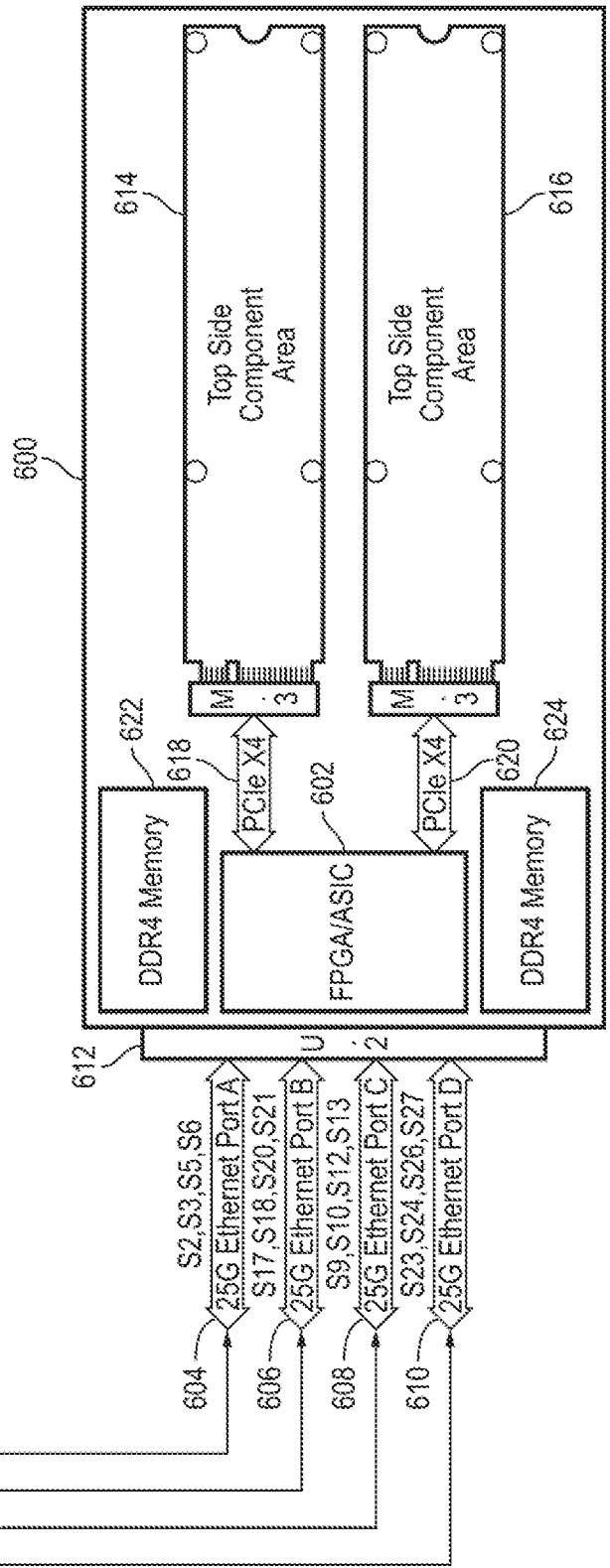
FIG. 6B.2

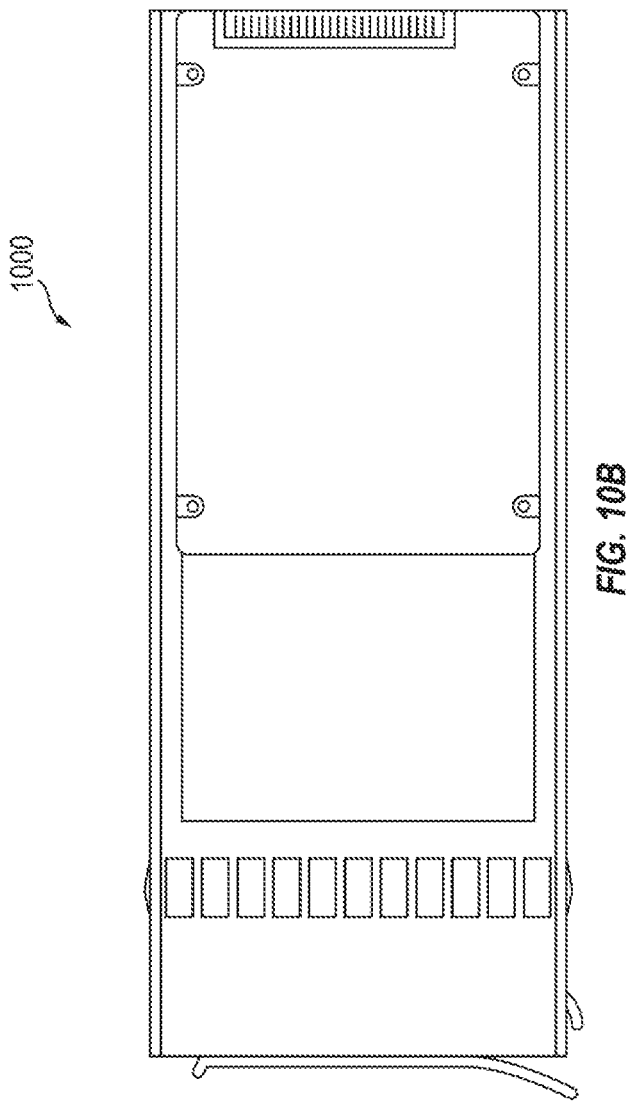

MULTI-MODE AND/OR MULTI-SPEED NON-VOLATILE MEMORY (NVM) EXPRESS (NVME) OVER FABRICS (NVME-OF) DEVICE

CROSS-REFERENCE TO RELATED APPLICATION(S)

This Patent Application claims the benefit of U.S. Provisional Patent Application Ser. No. 62/641,250, filed on Mar. 9, 2018 and entitled "METHOD AND APPARATUS FOR SUPPORTING A SINGLE FPGA+MULTIPLE NF1 SSDS," the entire content of which is hereby expressly incorporated by reference.

FIELD

One or more aspects of embodiments according to the present invention relate to network-attached devices, for example, a multi-mode and/or multi-speed Non-volatile memory (NVM) express (NVMe) over fabrics (NVMe-oF) device.

BACKGROUND

With NVM-oF configurations, e.g., configurations using Ethernet-attached NVMe solid state drives (SSDs), improving Ethernet and SSD cost and performance may be challenging. For example, Ethernet speed has increased with the advent of 50 G/100 G technology and beyond, while SSD performance may depend on the Peripheral Component Interconnect Express (PCIe) interface and NANDs technology. Fabric-attached SSDs may present additional unique design challenges for supporting erasure code data protection because each device may provide point-to-point connectivity.

Thus, a storage device capable of supporting both NVMe and NVMe-oF protocols and operating in different Ethernet speeds, is desirable.

The above information disclosed in this Background section is only for enhancement of understanding of the background of the invention and therefore it may contain information that does not constitute prior art.

SUMMARY

Aspects of embodiments of the present disclosure are directed toward a device including: a printed circuit board (PCB); at least one solid state drive (SSD) connected at a first side of the PCB via at least one SSD connector; at least one field programmable gate array (FPGA) mounted on the PCB at a second side of the PCB; and at least one connector attached to the PCB at a third side of the PCB, wherein the device is configured to operate in a first speed from a plurality of operating speeds based on a first input received via the at least one connector.

In an example, the at least one SSD includes a first SSD and a second SSD and the at least one SSD connector includes a first SSD connector and a second SSD connector, the first SSD is connected to the PCB at the first side of the PCB via the first SSD connector and the second SSD is connected to the PCB at the first side of the PCB via the second SSD connector, each of the first SSD and the second SSD being a new form factor 1 (NF1) SSD, wherein the at least one connector is an U.2 connector and each of the first SSD connector and the second SSD connector is a M.2 connector.

In an example, the at least one SSD connector is attached and electrically connected to the at least one SSD at a first side of the at least one SSD, the at least one SSD connector is attached to the PCB at the first side of the PCB and is perpendicular with respect to the first side of the PCB.

In an example, the device further includes a structural support located between the second side of the PCB and a second side of the at least one SSD, wherein the structural support is a plastic support or standoff. In an example, a length of the at least one SSD is 110 mm and a length of the PCB is between 110 and 142.2 mm. In an example, a first side of the at least one FPGA is attached to the second side of the PCB, the at least one FPGA is electrically connected to the PCB.

In an example, the device further includes a first interface layer attached at a third side of the at least one SSD and a second interface layer attached at a second side of the at least one FPGA, wherein the first interface layer and the second interface layer are used to transfer heat generated by the at least one SSD and the at least one FPGA during operation of the at least one SSD and the at least one FPGA.

In an example, the at least one connector is a SFF-TA-1008 connector. In an example, a length of the PCB is equal to or longer than a length of the at least one SSD. In an example, a length of the PCB is equal to or longer than a length of the at least one FPGA, a length of the at least one FPGA is 80 mm. In an example, the at least one SSD operates in a second speed from the plurality of operating speeds, wherein the plurality of operating speeds of the device are two or more speeds above 10 G. In an example, the first input is received from a mid-plane via the at least one connector, wherein the first input is controlled by using two general-purpose input/output (GPIO) pins controlled by a baseboard management controller (BMC) of a switch or a local central processing unit (CPU) of a motherboard, or one or more internal registers inside the FPGA.

In an example, a system includes: a first interface layer; at least one solid state drive (SSD) attached to the first interface layer at a first side of the at least one SSD; a printed circuit board (PCB) connected to the at least one SSD at a first side of the PCB via at least one SSD connector; at least one field programmable gate array (FPGA) mounted on the PCB at a second side of the PCB, wherein a first side of the FPGA is attached to the PCB; a second interface layer attached to the FPGA at a second side of the FPGA; and at least one connector attached to the PCB at a third side of the PCB, wherein the system is configured to operate in a first speed from a plurality of operating speeds based on a first input received via the at least one connector.

In an example, the at least one connector is an U.2 connector or a SFF-TA-1008 connector and the at least one SSD connector is a M.2 connector, the at least one SSD connector is perpendicular with respect to the first side of the PCB.

In an example, the system further includes a structural support located between the second side of the PCB and a second side of the at least one SSD, wherein the structural support is a plastic support or standoff. In an example, a length of the at least one SSD is 110 mm, a length of the PCB is between 110 and 142.2 mm, and a length of the at least one FPGA is 80 mm. In an example, a length of the PCB is equal to or longer than a length of the at least one SSD, and wherein the length of the PCB is equal to or longer than a length of the at least one FPGA.

In an example, a method including: attaching a first interface layer at a first side of at least one solid state drive (SSD); connecting the at least one SSD at a first side of a printed circuit board (PCB) via at least one SSD connector; mounting at least one field programmable gate array (FPGA) on a second side of the PCB, wherein a first side of the FPGA is attached to the PCB; attaching a second interface layer at a second side of the FPGA; and attaching at least one connector to a third side of the PCB, wherein the at least one SSD is configured to operate in a first speed from a plurality of operating speeds based on a first input received via the at least one connector.

In an example, the method further includes incorporating a structural support between the second side of the PCB and a second side of the at least one SSD, wherein the structural support is a plastic support or standoff and the at least one SSD connector is perpendicular with respect to the first side of the PCB. In an example, a length of the PCB is equal to or longer than a length of the at least one SSD, and wherein the length of the PCB is equal to or longer than a length of the at least one FPGA.

BRIEF DESCRIPTION OF THE DRAWINGS

These and other features of some example embodiments of the present invention will be appreciated and understood with reference to the specification, claims, and appended drawings, wherein:

FIG. 3A illustrates a configuration of an NVMe-oF device, according to some example embodiments of the present invention;

FIG. 3B illustrates a block diagram of an example SSD, according to some example embodiments of the present invention;

FIG. 5 illustrates an example table showing example use of an U.2 connector according to the configuration of an example multi-mode NVMe-oF device, according to some example embodiments of the present invention;

FIG. 6A (FIG. 6A.1 and FIG. 6A.2) illustrates a block diagram of an example NVMe-oF device operating in a non-high availability (non-HA), according to some example embodiments of the present invention;

FIG. 6B (FIG. 6B.1 and FIG. 6B.2) illustrates a block diagram of the example NVMe-oF device operating in a high-availability (HA) mode, according to some example embodiments of the present invention;

FIGS. 10A-10B illustrate a top view and a bottom view of an assembly, respectively, according to some example embodiment of the present invention.

DETAILED DESCRIPTION

Figure 1:
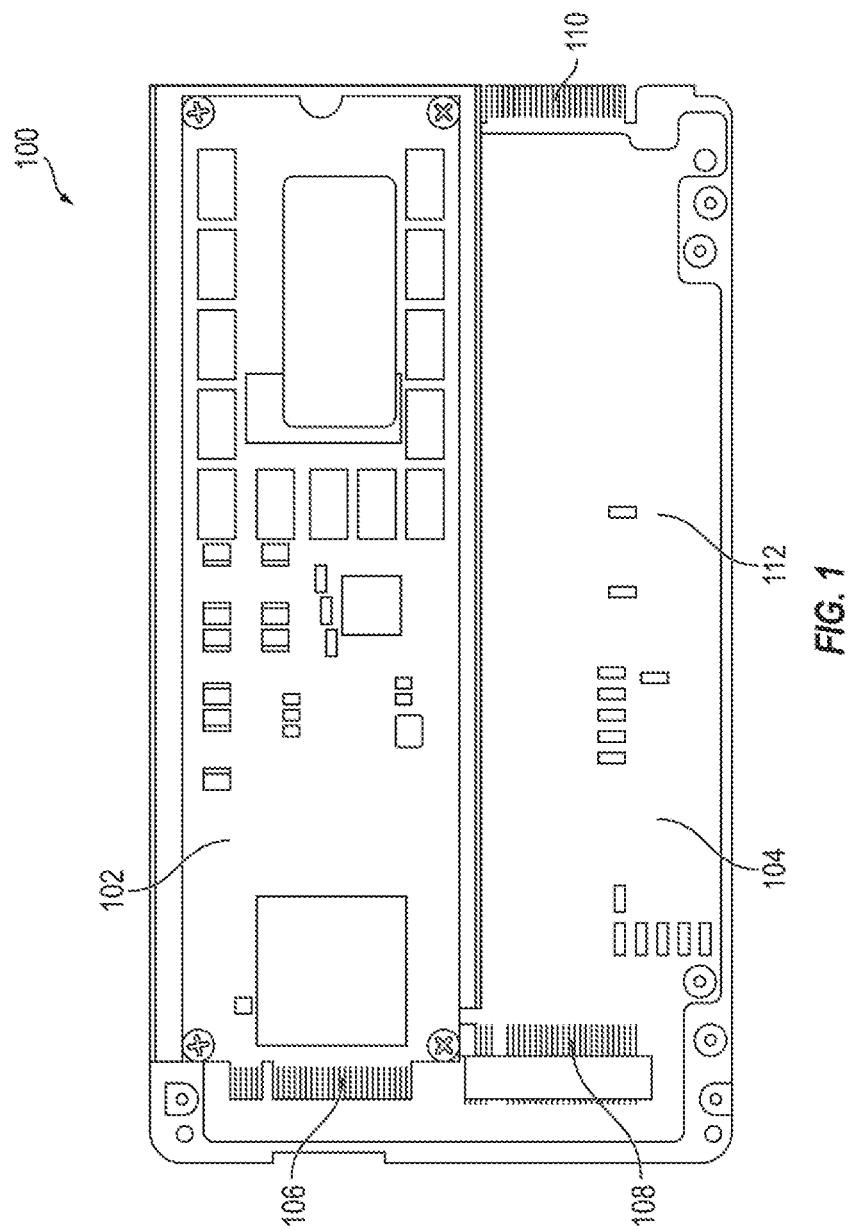
FIG. 1 illustrates a top view of an NVMe-oF device, according to some example embodiments of the present invention.

The detailed description set forth below in connection with the appended drawings is intended as a description of some example embodiments of a system and method for supporting multi-mode and/or multi-speed NVMe-oF devices provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the scope of the invention. As denoted elsewhere herein, like element numbers are intended to indicate like elements or features.

NVMe is a standard that defines a register-level interface for host software to communicate with a non-volatile memory subsystem (e.g., a SSD) over a PCIe bus. NVMe is an alternative to the Small Computer System Interface (SCSI) standard for connecting and transferring data between a host and a peripheral target storage device or system. PCIe-connected NVMe SSDs allow applications to communicate directly to storage.

The physical connection of the NVMe is based on a PCIe bus. A typical Ethernet SSD (eSSD) has a standard SSD (e.g. U.2) connector to interface with a system via a mid-plane over the PCIe bus. U.2 (SFF-8639) is a computer interface for connecting SSDs to a computer. A U.2 connector can support either two Serial Advanced Technology Attachment (SATA) or Serial Attached SCSI (SAS) ports and up to four lanes (X4) of parallel I/O in PCIe SSDs. If unused, the two PCIe lanes 1 and 2 may be optionally used as additional SAS ports if required. The U.2 connector is standardized for NVMe and supports PCIe 3.0 X4, providing five times the speed of a typical SATA SSD.

NVM-oF is an extension to the NVMe standard enabling operation over a variety of fabrics (or interconnects) other than PCIe. Herein, the term "fabric", represents a network topology in which network nodes can pass data to each other through a variety of interconnecting protocols, ports, and switches. For example, Ethernet-attached SSDs may attach directly to a fabric, and in this case the fabric is the Ethernet.

NVMe-oF enables the use of alternate transports to PCIe that extend the distances across which an NVMe host device and NVMe storage drive or subsystem can connect. Therefore, NVMe-oF is a technology specification designed to enable nonvolatile memory express message-based commands to transfer data directly between a host computer and a target solid-state storage device (e.g., eSSD or NVMe-oF device) or system over a network, such as Ethernet, Fibre Channel (FC) or InfiniBand. When configured to support the NVMe-oF standard, a system can support various fabrics including not only Ethernet, but also, Fibre Channel, InfiniBand, and other network fabrics. For example, eSSDs may attach directly to a fabric, and in this case the fabric is the Ethernet. An eSSD may refer to an SSD that may support the NVMe-oF protocols. For the convenience of illustration, the following examples and embodiments can show an Ethernet-attached NVMe-oF devices. However, it is noted that any other type of NVMe-oF devices can be used without deviating from the scope of the present disclosure.

As mentioned above, the physical connection of the NVMe is based on a PCIe bus. In recent times, with the advent of PCIe 4.0, bandwidth mismatch may be higher than PCIe 3.0. A single 25 G Ethernet does not have enough bandwidth to keep up with the backend by X4 PCIe 4.0 (up to 8 GB/s) from the SSD. A 50 G or 100 G Ethernet provides a better match for the X4 PCIe 4.0 from the SSD. Therefore, embodiments of the present invention may include a storage device (e.g., eSSD) that is capable of supporting both NVMe and NVMe-oF protocols, and when in the NVMe-oF mode, the storage device may be able to operate in different Ethernet speeds from 10 G up to 100 G or higher, without any changes to their hardware.

In one configuration, in order to support a device (e.g. a NVMe-oF device) speed of 100 G or more, the example embodiments of the present disclosure may have two small form factor (2.5 inch hard drive form-factor) SSDs packed together with a single field programmable gate array (FPGA). The single FPGA may be able to support multiple SSDs to increase the performance while keeping the same FPGA cost. Additionally, the example embodiments of the NVMe-oF device of the present disclosure with at least one FPGA and a plurality of SSDs, may fit in existing and/or new SSD form factors (e.g., small form factor (SFF) or a standard PCIe card form factor, e.g., a full-height, full length (FH-FL) card outline, or a full-height, half length (FH-HL) outline). The performance and capacity of the example embodiments of the NVMe-oF device of the present disclosure may also scale linearly by adding more similar devices and/or chassis.

Further, embodiments of the present invention may enable any platform system to support different types of NVMe-oF devices from different suppliers. By using common building blocks such as switch board, mid-plane and Ethernet SSDs, the eco-system providers may be able to go to market faster than the existing systems and offer various price/performance products to satisfy various customers. Some example embodiments may further enable a common system platform that is capable of supporting NVMe-oF devices with standard U.2 such as PM1725a or PM1735 and new emerging such as NF1 SSDs. In one configuration, the NF1 SSDs may also be called NGSFF or M.3 based SSDs.

The different embodiments of the present system provide a single platform and common building blocks that can support both NVMe and NVMe-oF devices, and when in the NVMe-oF mode, the system may be able to operate in different Ethernet speeds from 10 G and beyond without any changes to their hardware. The common building blocks that may support both NVMe and NVMe-oF devices may include a switch board, a mid-plane, and eSSDs. The present system may also provide a common system platform which is capable of supporting NVMe-oF devices with standard SSD connector such as PM1725a or PM1735 or M.3 or NGSFF based SSDs. The different configurations of the present system may also be compatible with technologies advancement such as 50 G and 100 G or higher speed Ethernet and PCIe 4.0. In particular, the different configurations of the present application provide a system that can support both the NVMe and NVMe-oF protocols, and various types of fabric-attached SSDs (e.g., eSSDs). Further, the different configurations of the present application may provide a disclosure regarding how the chassis and the device (e.g., eSSD) coordinate for the device to understand where it has been deployed and what personality it should adopt as a result of its deployment in a particular place in the data set.

The fabric-attached SSD (eSSD) disclosed herein is a single common device that may be used in multiple systems compatible with NVMe and NVMe-oF standards. Ethernet SSDs may use standard SSD connectors such as U.2 to interface with the host device via the mid-plane. The U.2 connectors may support 25 Gbps (100G-KR4) Ethernet. The eSSD disclosed herein may be a device that may be used in multiple systems compatible with NVMe and NVMe-oF standards. As such, the fabric-attached SSD (eSSD) may also be referred to as a multi-mode NVMe-oF device. The multi-mode NVMe-oF device may support either NVMe or NVMe-oF standard by detecting product information from a known location (e.g., chassis type pin E6 of the U.2 which maybe driven directly from the motherboard or the mid-plane). For example, a defined signal (e.g., a mode signal) on the U.2 connector may indicate to the drive whether to operate in NVMe or NVMe-oF mode. If present in an NVMe chassis, then the X4 lane PCIe of the U.2 connector will be driven by the PCIe engine of the eSSD controller. In this case, the device will disable the Fabric attached ports (e.g., Ethernet ports, Fibrechannel ports, or InfiniBand ports) and all NVMe protocols and functionalities are supported or enabled. If present in an NVMe-oF chassis, then the Fabric attached ports will be enabled by using only the unused and available SAS pins.

FIG. 1 illustrates a top view of an NVMe-oF device 100. The NVMe-oF device 100 of FIG. 1 includes at least one SSD 102, a FPGA printed circuit board (PCB) 104, at least two standard SSD connectors such as M.2 106 and 108, and at least one U.2 connector 110. The at least two M.2 connectors 106 and 108 may be vertical or 90 degree connectors to connect one or more SSDs (e.g., 102) to the FPGA PCB 104. The vertical M.2 connectors 106 and 108 are perpendicular with respect to a first side (e.g., a top side in FIG. 1) 112 of the FPGA PCB 104. The at least one SSD 102 may be a new form factor 1 (NF1) SSD. The at least one SSD 102 is connected to the FPGA PCB 104 at the first side 112 of the FPGA PCB 104 via the vertical M.2 connector 106. In one configuration, the length of the at least one SSD 102 may be 110 mm and the length of the FPGA PCB 104 may be between 110 and 142.2 mm, otherwise the NVMe-oF device 100 may not be inserted into a standard chassis. In an example, the M.2 standard allows module or chassis widths of 12 mm, 16 mm, 22 mm, and 30 mm, and lengths of 16 mm, 26 mm, 30 mm, 38 mm, 42 mm, 60 mm, 80 mm, and 110 mm. In an example, the length of the FPGA PCB 104 may be equal to or longer than the length of the at least one SSD 102.

In an example, an additional SSD may also be connected at the first side 112 of the FPGA PCB 104 via the vertical M.2 connector 108. In one configuration, the NVMe-oF device 100 may support, via the U.2 connector 110, a plurality of SAS ports (e.g., SAS0 and SAS1) and up to four PCIe X4 lanes. The two SAS ports (SAS0 and SAS1) may be used as Ethernet ports by the NVMe-oF device 100. The NVMe-oF device 100 may be able to operate in different Ethernet speeds from 10 G up to 100 G or higher, without any changes to the hardware. In an example, a SFF-TA-1008 connector may be used in place of the U.2 connector 110 to connect the NVMe-oF device 100 with a mid-plane via a SFF-TA-1002 connector, which may be connected to the mid-plane.

In one example, an FPGA (shown, for example, in FIG. 2) may be connected to the FPGA PCB 104 in a second side opposite to the first side 112 of the FPGA PCB 104 to which the at least one SSD 102 is connected via the vertical M.2 connector 106. In one configuration, when the NVMe-oF device is placed in a casing, one or more layers of thermal interface material (TIM) may be placed between the casing and the NVMe-oF device 100. In an example, the length of the FPGA PCB 104 may be equal to or longer than a length of the at least one SSD 102 and the FPGA. In one configuration, the length of the FPGA may be 80 mm.

In one example, the power loss protection component, such as super caps and/or the controller ASIC in the NF1 SSD 102 may be migrated from the NF1 SSD 102 to the FPGA PCB 104, to make additional space available in the NF1 SSD 102 for additional NAND flash packages to extend storage capacity of the NF1 SSD 102.

Figure 2:
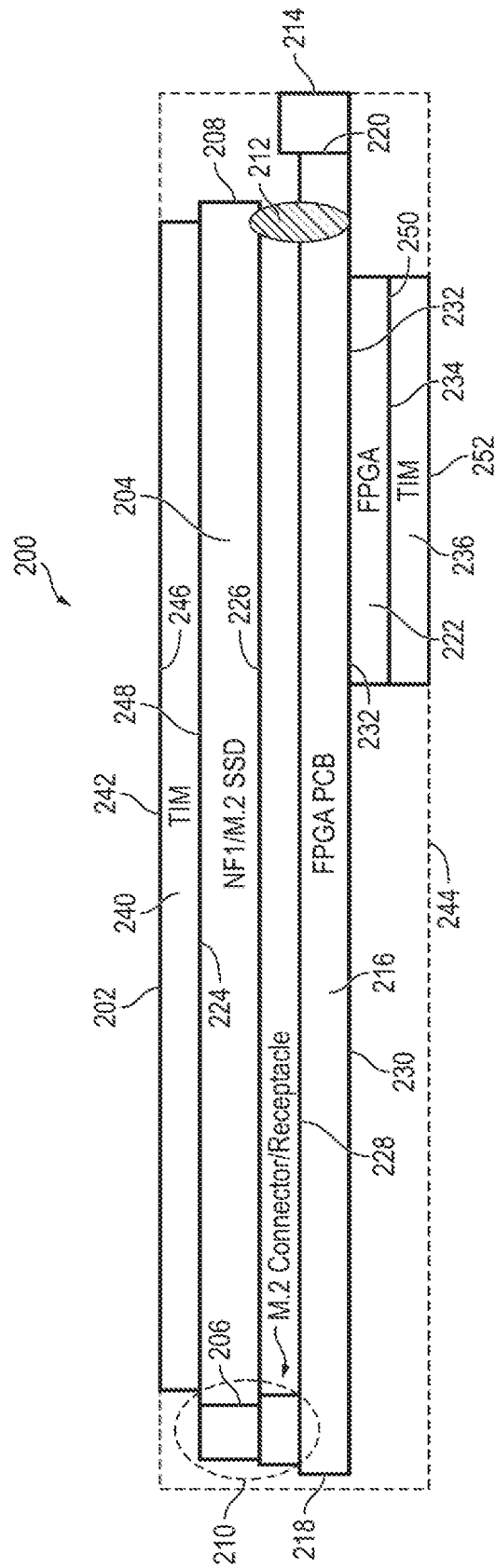
FIG. 2 illustrates a cross sectional view of an NVMe-oF device, according to some example embodiments of the present invention.

FIG. 2 illustrates a cross sectional view of an NVMe-oF device 200 in a metal casing 202. The NVMe-oF device 200 may be the NVMe-oF device 100 of FIG. 1. The NVMe-oF device 200 includes a metal casing 202, a first TIM layer 240, at least one NF1 SSD 204, at least one vertical M.2 connector 210, a plastic or metal support or standoff 212, an FPGA PCB 216, an FPGA 222, a second TIM layer 236, and a standard SSD connector such as U.2 connector 214.

In the example embodiment of FIG. 2, a first side 246 of the first TIM layer 240 is attached to (or in thermal contact with) a first side 242 of the metal or thermal conductive casing 202. A second side 248 of the first TIM layer 240 is attached to (or in thermal contact with) a first side 224 of the NF1 SSD 204. The NF1 SSD 204 is connected to the FPGA PCB 216 via the vertical M.2 connector 210, which is attached and electrically connected to the NF1 SSD 204 at the second side 206 of the NF1 SSD 204. The vertical M.2 connector 210 is mounted on the FPGA PCB 216. In an example, the vertical M.2 connector 210 and the FPGA PCB 216 are separated by an air gap. In one configuration, the length of the NF1 SSD 204 may be standard length (e.g., 110 mm) and the length of the FPGA PCB 216 may be longer than 110 mm. In an example, the length of the FPGA PCB 216 may be equal to or longer than the length of the NF1 SSD 204.

In an example, a plastic (or other suitable insulating material) support or standoff 212, that provides structural support to the NF1 SSD 204, may be located between a third side 230 of the FPGA PCB 216 and the third side 226 of the NF1 SSD 204. The plastic support or standoff 212 may be located adjacent to the fourth side 220 of the FPGA PCB 216 and the fourth side 208 of the NF1 SSD 204.

In an example, the U.2 connector 214 is mounted on and electrically connected to the FPGA PCB 216. In one configuration, the NVMe-oF device 200 may support, via the U.2 connector 214, a plurality of SAS ports (e.g., SAS0 and SAS1) and up to four PCIe X4 lanes of a PCIe X4 bus. The two SAS ports (SAS0 and SAS1) are unused by the NVMe device and may be used as Ethernet ports by the NVMe-oF device 200. The NVMe-oF device 200 may be able to operate in different Ethernet speeds from 10 G up to 100 G or higher, without any changes to the hardware.

In the NVMe-oF device of FIG. 2, the third side 230 of the FPGA PCB 216 is attached to a first side 232 of the FPGA 222. In an example, the FPGA 222 may be mounted on the third side 230 of the FPGA PCB 216 and electrically connected to the FPGA PCB 216. A second side 234 of the FPGA 222 is attached to (or in thermal contact with) the second TIM layer 236 at a first side 250 of the second TIM layer 236. A second side 252 of the second TIM layer 236 is attached to (or in thermal contact with) the second side 244 of the metal casing 202. The first TIM layer 240 and the second TIM layer 236 may be used to spread and dissipate the heat generated by the electronic devices such as NF1 SSD 204 and by the FPGA 222 during the normal operation of the NF1 SSD 204 and the FPGA 222, to prevent overheating of the NVMe-oF device 200 by transferring the generated heat to outside of the NVMe-oF device 200 via the casing 202. In an example, the length of the second TIM layer 236 may be equal to or longer than the length of the FPGA 222. Additional pieces of TIM may be required for other electronic devices such as DDR4 memory (as shown in FIG. 3A).

FIG. 3A illustrates a configuration of an NVMe-oF device 300. The NVMe-oF device 300 may be the NVMe-oF device 100 of FIG. 1 or the NVMe-oF device 200 of FIG. 2. The NVMe-oF device 300 of FIG. 3A includes a FPGA 302, a first NF1 SSD 314, a second NF1 SSD 316, two double data rate fourth-generation (DDR4) memories (322 and 324), and four capacitors (326, 328, 330, and 332). The NVMe-oF device 300 is also connected to a U.2 connector 312 and via the U.2 connector 312, NVMe-oF device 300 may support two SAS ports (SAS0 and SAS1) and up to four PCIe X4 lanes of a PCIe X4 bus. The two SAS ports (SAS0 and SAS1) may be used as Ethernet ports by the NVMe-oF device 300. The NVMe-oF device 300 may be able to operate in different Ethernet speeds from 10 G up to 100 G or higher, without any changes to the hardware.

FIG. 3B illustrates a block diagram of an example NF1 SSD 334, according to one embodiment. NF1 SSD 334 may be SSD 314 or SSD 316 of FIG. 3A. The new form factor 1 (NF1) of the NF1 SSD 334 may accommodate multiple rows or channels of NAND flash devices, and thus maximize capacities of modular SSDs. The NF1 SSD 334 may be connected to a FPGA via a PCIe X4 bus 336. The FPGA may be the FPGA 302 of FIG. 3A and the PCIe X4 bus 336 may be one of the PCIe X4 busses 318 or 320 of FIG. 3A. The NF1 SSD 334 may also accommodate at least one optional Ethernet port 338 (Ethernet port A and/or Ethernet port B) using the unused or reserved (e.g., high speed) pins of M.2 connector used for connecting to the FPGA (e.g., FPGA 302 of FIG. 3A). The at least one Ethernet port 338 may be used when the NF1 SSD 334 is operating in NVMe-oF mode.

In some embodiments, the NF1 SSD 334 may conform to a 2.5 inch hard drive form-factor (or small form factor (SFF)) standard but with extended length. In other embodiments, the NF1 SSD 334 may conform to a standard PCIe card form factor, e.g., a full-height, full length (FH-FL) card outline, or a full-height, half length (FH-HL) outline. The NF1 SSD 334 may also include a controller, buffer memory, and flash memory. The controller may execute software, NVMe commands, and/or firmware, stored, for example, in the buffer memory, or in read-only memory in the controller (or separate from the controller). In FIG. 3B, the eSSD ASIC 340 is an enhanced SSD controller which contains Flash Translation Layer (FTL) and Flash controllers. In an example, eSSD ASIC 340 may be used as a power loss protection component in the NF1 SSD 334.

Returning back to FIG. 3A, the NVMe-oF device 300 may be configured to operate in either NVMe mode or NVMe-oF mode. In the NVMe-oF mode, the NVMe-oF device 300 may configure two PCIe lanes (PCIe 1 and PCIe 2) as Ethernet port 306 (Ethernet port B) and Ethernet port 310 (Ethernet port D). The NVMe-oF device 300 may further configure the two SAS ports (SAS0 and SAS1) as Ethernet port 304 (Ethernet port A) and Ethernet port 308 (Ethernet port C). The first 25 G Ethernet port 304 may be connected at pins S2, S3, S5, and S6 of the U.2 connector 312, the second 25 G Ethernet port 306 may be connected at pins S17, S18, S20, and S21 of the U.2 connector 312, the third 25 G Ethernet port 308 may be connected at pins S9, S10, S12, and S13 of the U.2 connector 312, and the fourth 25 G Ethernet port 310 may be connected at pins S23, S24, S26, and S27 of the U.2 connector 312. When in the NVMe-oF mode, the NVMe-oF device 300 may be able to operate in different Ethernet speeds from 10 G up to 100 G or higher.

In FIG. 3A, when the NVMe-oF device 300 is configured in NVMe-oF mode, the FPGA 302 may provide an interface between the four 25 Gbps Ethernet ports (304, 306, 308, 310) and the two NF1 SSDs (314, 316). The four 25 G Ethernet ports (304, 306, 308, 310) may be connected to a motherboard over a mid-plane depending on the mode of operation of the NVMe-oF device 300. In one configuration, the motherboard may include one or more switching elements, one or more memory elements, one or more I/O elements, or the like. The FPGA 302 interfaces with the first NF1 SSD 314 via a first PCIe X4 bus 318 and the FPGA 302 interfaces with the second NF1 SSD 316 via a second PCIe X4 bus 320. The first PCIe X4 bus 318 and the second PCIe X4 bus 320 may be connected to the first NF1 SSD 314 and the second NF1 SSD 316 over their respective M.2/M.3 connectors. In this case, the unused or reserved (e.g., high speed) pins of M.2 connectors attached to the SSDs 314 and 316, may be used for Ethernet connection. In this mode, the FPGA 302 may function as an NVMe-oF target. The NVMe-oF target implemented on the eSSD ASIC/FPGA 302 provides all network and storage protocol processing which obviates the need for an X86-based central processing unit (CPU) on a motherboard in the target device. For an NVMe-oF based system, an X86-based CPU on a motherboard is no longer required to move data between an initiator (e.g., host software) and a target device (i.e., an NVMe-oF device) because the target device is capable of moving data by itself.

In one configuration, when the multi-mode NVMe-oF device 300 is in the NVMe-oF mode, the NVMe-oF device 300 may have two X1 PCIe lanes (PCIe 0 and PCIe 3) for control plane for the first (port A) and second (port B) Ethernet ports. Such configurations may make two PCIe lanes (PCIe 1 and PCIe 2) available to be used for additional 25 G Ethernet ports (Ethernet port B and D). In some configurations, when the NVMe-oF device 300 is operating in 10 G (single port or dual port) or 25 G (single port or dual port) speed in the NVMe-oF mode, SAS port 0 is used for the Ethernet port A (first port), and the SAS port 1 is not used. The PCIe lanes 0 and 3 are used as a control plane for the first (port A) and second (port B) Ethernet attached NVMe-oF controllers, PCIe lane 1 is used for Ethernet port B (second port), and the PCIe lane 2 is not used. In some other configurations, when the NVMe-oF device 300 is operating in 50 G (single port or dual port) or 100 G (single port only) speed in the NVMe-oF mode, SAS port 0 is used for the Ethernet port A (first port) and the SAS port 1 is used as Ethernet port C (third port). The PCIe lanes 0 and 3 are used as a control plane for the first (port A) and second (port B) Ethernet attached NVMe-oF controllers, PCIe lane 1 is used for Ethernet port B (second port), and the PCIe lane 2 is used for Ethernet port D (fourth port). When the NVMe-oF device 300 is operating in 100 G speed in the NVMe-oF mode, PCIe lane 3 is not used because dual port is not supported in 100 G speed.

In one configuration, the NVMe-oF device 300 may be configured in an NVMe mode. In the NVMe mode, the NVMe-oF device 300 may use all of the four PCIe X4 lanes (in a single port mode) to carry PCIe signals over the PCIe X4 bus. The PCI X4 bus is connected to a mid-plane and the PCIe bus is used as data and control planes. In an aspect, at a given time, the first NF1 SSD 314 and the second NF1 SSD 316 of the NVMe-oF device 300 may both operate in either NVMe mode or NVMe-oF mode. In another aspect, at a given time, the first NF1 SSD 314 may operate in the NVMe mode and the second NF1 SSD 316 may operate in the NVMe-oF mode. In yet another aspect, at a given time, the first NF1 SSD 314 may operate in the NVMe-oF mode and the second NF1 SSD 316 may operate in the NVMe mode.

The operational mode of the NVMe-oF device 300 may be self-configured or externally set using a physical pin (e.g., a Pin E6 of U.2 connector 312 may be used as a chassis type pin indicating the protocol (NVMe or NVMe-oF) that may be used on the chassis) or by an in-band command from a baseboard management controller (BMC) of the motherboard. The manageability information retrieved through Ethernet is referred to as "in-band" information whereas the manageability information retrieved through the PCIe bus is referred to as "out-of-band" information. When configured as an NVMe-oF device, the multi-mode NVMe-oF device 300 (chassis type pin E6=high), may be configured in either the single port NVMe-oF mode or the dual port NVMe-oF mode. In the single port NVMe-oF mode, the pin E25 of U.2 connector 312 may be high (not asserted or not active) and in the dual port NVMe-oF mode, the pin E25 of U.2 connector 312 may be asserted low or active.

Figure 4:
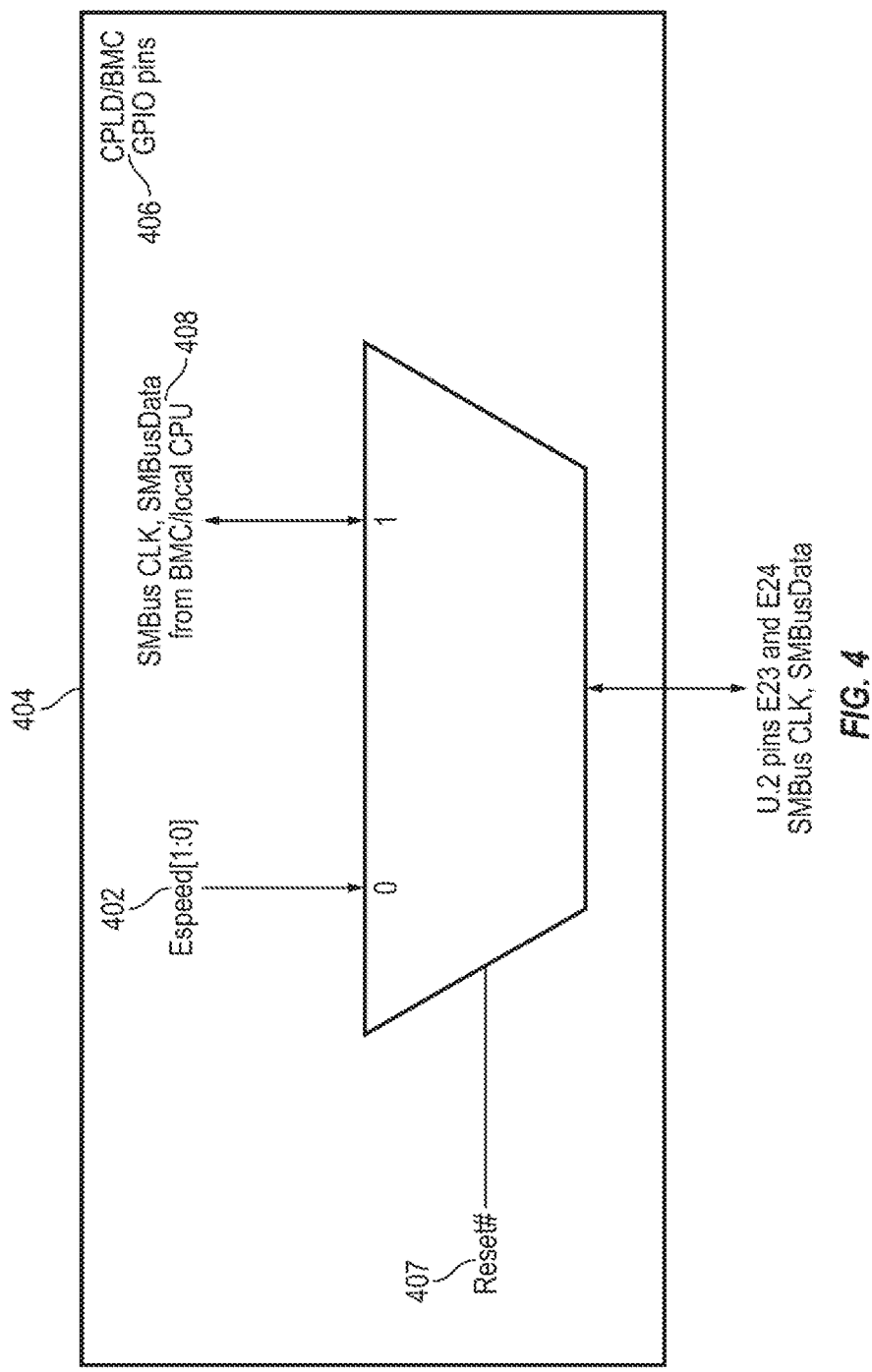
FIG. 4 illustrates a block diagram of a mid-plane or complex programmable logic device (CPLD), according to some example embodiments of the present invention.

In one configuration, as shown in FIG. 4, the different operating speeds of the NVMe-oF device 300 may be accomplished by using two additional general-purpose input/output (GPIO) (ESpeed [1:0]) pins 402 located on the mid-plane or by the CPLD 404 during Reset #407 signal is asserted, which may be controlled by a BMC or local CPU of a motherboard, or external pins on the mid-plane. The output of the MUX is connected to the pins E23 and E24 of the U.2 connector 312. In the former option, the ESpeed pins 402 are muxed with U.2 I2C pins inside the CPLD 404 and may be latched after reset 407 has been asserted (hi to lo). In one configuration, the inputs to the MUX are driven by CPLD 404 or BMC or local CPU of the motherboard. However, in some configurations, the location of the MUX is inside the CPLD 404. The number of MUXes is equal to max number of supported NVME-oF devices or slots in the chassis. This way each device can be reset individually, independently and may operate at different Ethernet speed. This approach can support hot-pluggable events (hot add and hot removal). If there is one MUX to share for all devices, then when a new device is hot inserted, it may impact the existing devices in the chassis due to the reset cycle, which may be undesirable.

In case, the CPLD 404 is controlled by the BMC or local CPU of the motherboard, the control signal from the BMC or local CPU may be received at the CPLD/BMC GPIO pins 406 at the CPLD 404. The following Table 1 illustrates the status of the ESpeed pins during different operating speeds of the NVMe-oF device 300.

TABLE 1

| Ethernet Speed | ESpeed Pin 1 | ESpeed Pin 0 |
|---|---|---|
| 10G | Hi | Hi |
| 25G | Hi | Lo |
| 50G | Lo | Hi |
| 100G | Lo | Lo |

Further, the Ethernet speed is selected using SMBus 408 during power on reset or PCIe reset. In one configuration, a multiplexer is selected by power on or reset signal 407, and when the reset 407 is active low the multiplexer may select Espeed (0:1) 402 to the FPGA 302 via external register chip and when the reset 407 is high the multiplexer may connect the SMBus 408 of each slot to the BMC on the switch board. In an example, during reset, the FPGA 302 may not be fully functional. It may take several minutes for the FPGA 302 to completely download the bit-files (images). During download of the bit-files, the FPGA 302 may select appropriate Ethernet related bit-files based on the Ethernet speed input pins from the registered buffer chip.

In one configuration, the multi-mode NVMe-oF device 300 may be configured in either as a single port or a dual port in the NVMe mode, or in the NVMe-oF mode.

FIG. 5 shows example use of the U.2 connector 312 according to the configuration of the multi-mode NVMe-oF device 300. When configured as an NVMe device (chassis type pin E6=low), the multi-mode NVMe-oF device 300 may be configured in either the single port NVMe mode or the dual port NVMe mode depending on the dual port EN #pin E25 of U.2 connector 312. In the single port NVMe mode, the dual port EN #pin E25 of U.2 connector 312 may be asserted high (not active). In the single port NVMe mode, the PCIe lanes 0-3 of the U.2 connector 312 are used as a single by 4 lanes. In the dual port NVMe mode, the dual port EN #pin E25 of U.2 connector 312 may be asserted low (active). In the dual port NVMe mode, the PCIe lanes 0-3 are split into 2 by 2 lanes; the PCIe lanes 0 and 1 are used for the first port (port A), and the PCIe lanes 2 and 3 are used for the second port (port B).

In some configurations, if the product information is stored in a chassis (e.g. via an EEPROM or CPLD), the selection of two by two lanes (in a dual port mode) or a single by four lanes (in a single port mode) of the PCIe bus on the U.2 connector 312 may be driven by the EEPROM. When operate in NVMe mode, the multi-mode NVMe-oF device 300 may disable the Ethernet engine(s), and the NVMe protocols and functionalities are supported or enabled. When operate as NVME-oF device, the product information is used to configure appropriate of SAS and PCIe ports per selected Ethernet speed and dual port functionality.

In some configurations, the product information used for self-configuration is stored in the chassis as part of a vital product data (VPD). During the start-up, the multi-mode NVMe-oF device 300 may retrieve the VPD information from the chassis and configure itself based on the VPD. In some configurations, the multi-mode NVMe-oF device 300 can be configured in various manners without deviating from the scope of the present disclosure. For example, the multi-mode NVMe-oF device 300 can be configured by a control command over the PCIe bus issued by a BMC of the motherboard to which the multi-mode NVMe-oF device 300 is connected to. The present system provides a platform that may support various types of NVMe and NVMe-oF devices in non-high availability (non-HA) mode (i.e., single-path input/output (I/O)) or HA mode (i.e., multi-path I/O) with minimum hardware changes.

Further details regarding method of operating the multi-mode NVMe-oF device 300 may be found at the U.S. Non-Provisional patent application Ser. No. 16/007,949, filed on Jun. 13, 2018 and entitled "SYSTEM AND METHOD FOR SUPPORTING MULTI-MODE AND/OR MULTI-SPEED NON-VOLATILE MEMORY (NVM) EXPRESS (NVME) OVER FABRICS (NVME-OF) DEVICES," the entire content of which is hereby expressly incorporated by reference.

FIG. 6A (FIG. 6A.1 and FIG. 6A.2) illustrates a block diagram of an example NVMe-oF device 600 operating in a non-HA mode, according to one embodiment. The NVMe-oF device 600 may be the NVMe-oF device 100 of FIG. 1, or the NVMe-oF device 200 of FIG. 2, or the NVMe-oF device 300 of FIG. 3. In this example, the NVMe-oF device 600 may support single-path I/Os and may be able to operate in different Ethernet speeds of 10 G and 25 G, without any changes to the hardware. The NVMe-oF device 600 may include a FPGA 602, a first NF1 SSD 614, a second NF1 SSD 616, and two DDR4 memories (622 and 624). The FPGA 602 interfaces with the first NF1 SSD 614 via a first PCIe X4 bus 618 and the FPGA 602 interfaces with the second NF1 SSD 616 via a second PCIe X4 bus 620. The NVMe-oF device 600 is also connected to a U.2 connector 612 and via the U.2 connector 612, the NVMe-oF device 600 may support two SAS ports (SAS0 and SAS1) and up to four PCIe X4 lanes of a PCIe X4 bus. The two SAS ports (SAS0 and SAS1) may be used as Ethernet ports. The NVMe-oF device 600 may configure two PCIe lanes (PCIe 1 and PCIe 2) as Ethernet ports 606 (Ethernet port B) and 610 (Ethernet port D). The NVMe-oF device 600 may further configure the two SAS ports (SAS0 and SAS1) as Ethernet ports 604 (Ethernet port A) and 608 (Ethernet port C). The first 25 G Ethernet port 604 may be connected at pins S2, S3, S5, and S6 of the U.2 connector 612, the second 25 G Ethernet port 606 may be connected at pins S17, S18, S20, and S21 of the U.2 connector 612, the third 25 G Ethernet port 608 may be connected at pins S9, S10, S12, and S13 of the U.2 connector 612, and the fourth 25 G Ethernet port 610 may be connected at pins S23, S24, S26, and S27 of the U.2 connector 612.

In one configuration, the Ethernet ports 604, 606, 608, and 610, may be connected to a motherboard 601 over a mid-plane 626 via several high speed Molex connectors 628 that may collectively carry all the Ethernet ports 604, 606, 608, and 610 and other non-high speed control signals such as SMBus, reset, clock, etc. The motherboard 601 may include a local CPU 634, a BMC 632, an Ethernet switch controller 636, a PCIe switch 638, and two DDR4 memories (640 and 642). In some configurations, the motherboard 601 may push various signals to NVMe-oF device 600 and perform various services on NVMe-oF device 600 over the Ethernet ports 604, 606, 608, and 610, over the mid-plane 626. For example, the motherboard 601 may receive device-specific information from the NVMe-oF device 600 over the Ethernet ports 604, 606, 608, and 610, including, but not limited to, health status information, field-replaceable unit (FRU) information, and sensor information of the NVMe-oF device 600. The motherboard 601 may also perform various services over the Ethernet ports 604, 606, 608, and 610 including, but not limited to, discovery services to a BMC (e.g., BMC 632) or a local host CPU (e.g., CPU 634) and download services for a new eSSD firmware for performing a firmware upgrade.

FIG. 6B (FIG. 6B.1 and FIG. 6B.2) illustrates a block diagram of the example NVMe-oF device 600 of FIG. 6A operating in a HA mode, according to one embodiment. In this example, the NVMe-oF device 600 may support multi-path I/Os and may be able to operate in different Ethernet speeds of 10 G and 25 G, without any changes to the hardware. In HA mode, NVMe-oF device 600 may be connected to two motherboards 601 and 603 to support multi I/O in a dual port configuration (in a HA mode) via the mid-plane 626. Depending on the system configuration, signal integrity may need to be tested to ensure that the common mid-plane 626 may support for both configurations. If the signal integrity is not sufficient, the system can have two versions of mid-planes including the first mid-plane for the HA mode and the second mid-plane for the non-HA mode. E25 pin of the U.2 connector 612 can be used to enable the dual port configuration. The NVMe-oF device 600 can self-configure its operational mode using a physical pin (e.g., a vendor defined pin (Pin E6) on the chassis of the motherboard (601 or 603)) or by an in-band command from a BMC (632 or 644) of the motherboard (601 or 603 not shown).

In one configuration, when operating in HA mode, the Ethernet port 604 (Ethernet port A) and Ethernet port 606 (Ethernet port B) of the NVMe-oF device 600 may be connected to the motherboard 601 over the mid-plane 626 via the high speed Molex connectors 628 that may collectively carry the Ethernet ports 604 and 606 and other non-high speed control signals such as SMBus, reset, clock, etc. Also, in HA mode, the Ethernet port 608 (Ethernet port C) and Ethernet port 610 (Ethernet port D), of the NVMe-oF device 600, may be connected to the second motherboard 603 over the mid-plane 626 via several high speed Molex connectors 656 that may collectively carry the Ethernet ports 608 and 610 and other non-high speed control signals such as SMBus, reset, clock, etc. The second motherboard 603 may include a local CPU 646, a BMC 644, an Ethernet switch controller 648, a PCIe switch 650, and two DDR4 memories (652 and 654).

Because the multi-mode NVMe-oF device 600 may operate both in the NVMe and NVMe-oF modes, the cost for developing and deploying the devices may be reduced because the same devices may be used in the NVMe mode and the NVMe-oF mode. For the similar reason, the multi-mode NVMe-oF device 600 may have a faster time to the market. The multi-mode NVMe-oF device may be used in various products and chassis. The two lanes of the PCIe bus are reserved for standard features through a control plane. A local CPU, a BMC, and other devices may use the two lanes of the PCIe bus as a control plane to communicate to each NVMe-oF device inside the chassis at no additional cost. The NVMe mid-plane may be used as unmodified, and there is no need for a new connector on the NVMe-oF device 600 due to the additional GPIO pins (e.g., ESpeed [1:0] 402 of FIG. 4) located on the mid-plane 626. Further, it is desirable for any platform system to support different types of NVMe-oF devices from different suppliers. By using common building blocks such as switch board, mid-plane and Ethernet SSDs, the different embodiments of the present application may enable the existing eco-system providers to go to market a lot faster and offer various price/performance products to satisfy various customers. It is also desirable to have a common system platform which is capable of supporting NVMe-oF devices with standard U.2 such as PM1725a or PM1735 and new emerging such as M.3 or NGSFF based SSDs.

Figure 7A:
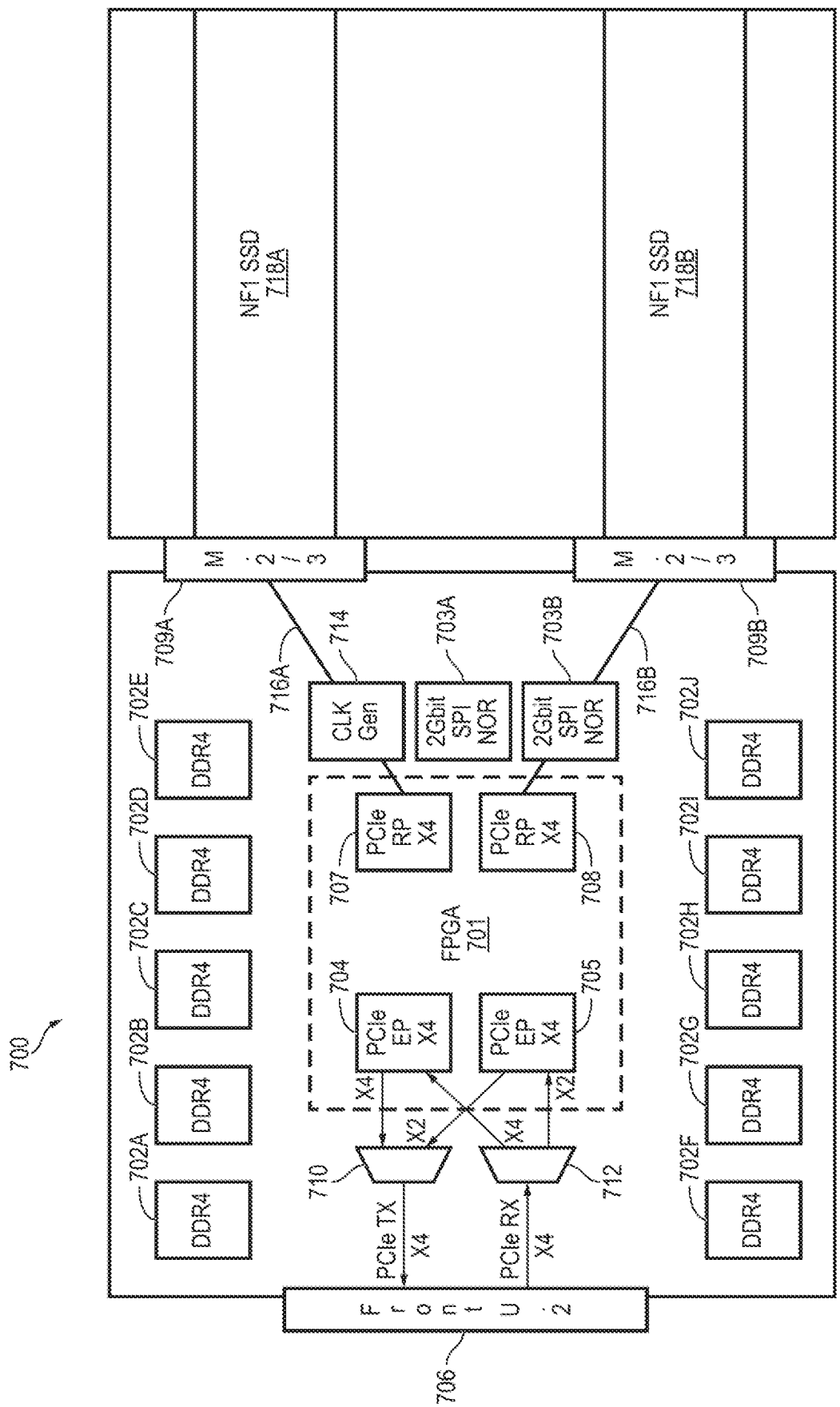
FIG. 7A illustrates a block diagram of an example field programmable gate array (FPGA) device connected to one or more SSDs, according to some example embodiments of the present invention.

FIG. 7A is a block diagram illustrating an example FPGA device 700 connected to two NF1 SSDs (718A, 718B), according to one embodiment. The FPGA device 700 may include a FPGA 701. The FPGA 701 may provide an interface between a U.2 connector 706 and a plurality of flash drives, for example, 703A and 703B. The FPGA 701 may interface with the NF1 SSD 718A via a port 707 connected to a PCIe X4 bus 716A through the M.2 connector 709A. The FPGA 701 may interface with the NF1 SSD 718B via a port 708 connected to a PCIe X4 bus 716B through the M.2 connector 709B. In one configuration, the M.2 connectors 709A and 709B may be vertical or 90 degree connectors to laterally connect the NF1 SSDs 718A and 718B to the FPGA device 700. The FPGA 701 may also be connected to a plurality of DDR4 memories, for example, 702A-702J. The FPGA 701 is also connected to flash drives 703A-703B and a clock circuit 714.

The U.2 connector 706 may be connected to the FPGA 701, via two PCIe X4 busses 704 and 705 through two multiplexers 710 and 712. The PCIe X4 bus 704 may be used to transmit signal or packets to a motherboard over a mid-plane via U.2 connector 706 through multiplexer 710, and the PCIe X4 bus 705 may be used to receive packets from a motherboard over a mid-plane via U.2 connector 706 through multiplexer 712. In some configurations, the different operating speeds of the plurality of flash drives, for example, NF1 SSDs (718A, 718B), connected to the FPGA 701 may be accomplished by using two additional GPIO (Espeed [1:0]) pins (e.g., pins 402 of FIG. 4) located on the mid-plane or CPLD (e.g., 404 of FIG. 4), which may be controlled by one or more internal registers inside the FPGA 701. Table 1 illustrates the status of ESpeed pins during different operating speeds of the flash drives 703A and 703B connected to the FPGA 701.

Figure 7B:
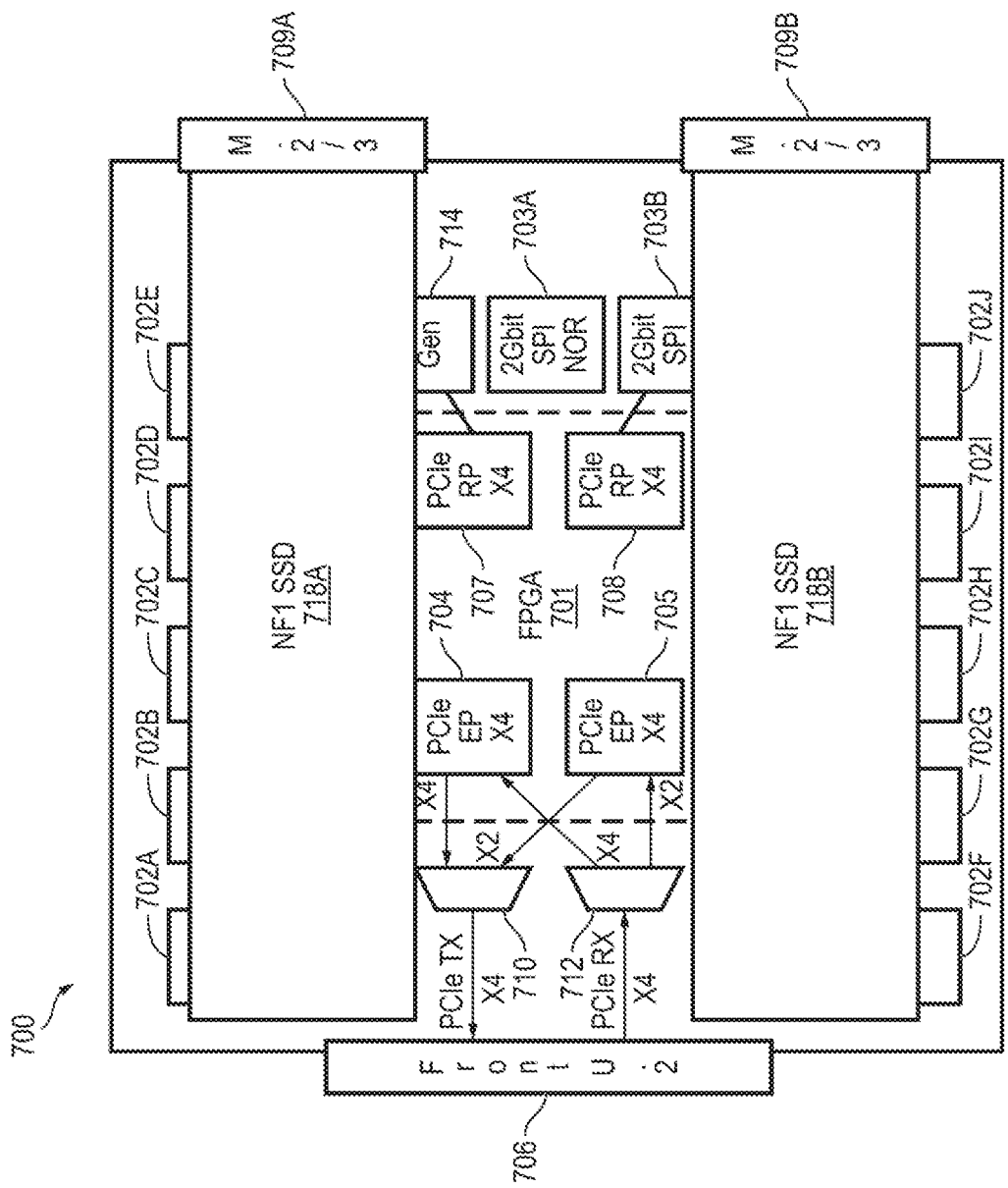
FIG. 7B illustrates another block diagram of an example FPGA device connected to one or more SSDs, according to some example embodiments of the present invention.

FIG. 7B illustrates a physical constriction of the FPGA device 700 of FIG. 7A. In FIG. 7B, the FPGA device 700 is connected to the first NF1 SSD 718A via the first vertical M.2 connector 709A, and to the second NF1 SSD 718B via the second vertical M.2 connector 709B. A top view of the assembly (FPGA device 700 and the NF1 SSDs 718A and 718B) of FIG. 7B may appear as the NF1 SSDs 718A and 718B are placed on top of the FPGA device 700. In one configuration, the assembly (FPGA device 700 and the NF1 SSDs 718A and 718B) of FIG. 7B may be NVMe-oF device 100 of FIG. 1 or the NVMe-oF device 200 of FIG. 2, and may support, via the U.2 connector 706, a plurality of SAS ports (e.g., SAS0 and SAS1) and up to four PCIe X4 lanes of a PCIe X4 bus. The two SAS ports (SAS0 and SAS1) may be used as Ethernet ports by the assembly (FPGA device 700 and the NF1 SSDs 718A and 718B) of FIG. 7B. The assembly (FPGA device 700 and the NF1 SSDs 718A and 718B) of FIG. 7B may be able to operate in different Ethernet speeds from 10 G up to 100 G or higher, without any changes to the hardware.

In one example, the FPGA 701 may be connected to the FPGA PCB 720 in a second side (not shown) opposite to the side of the FPGA PCB 720 to which the first NF1 SSD 718A is connected via the first vertical M.2 connector 709A and the second NF1 SSD 718B is connected via the second vertical M.2 connector 709B.

Figure 8:
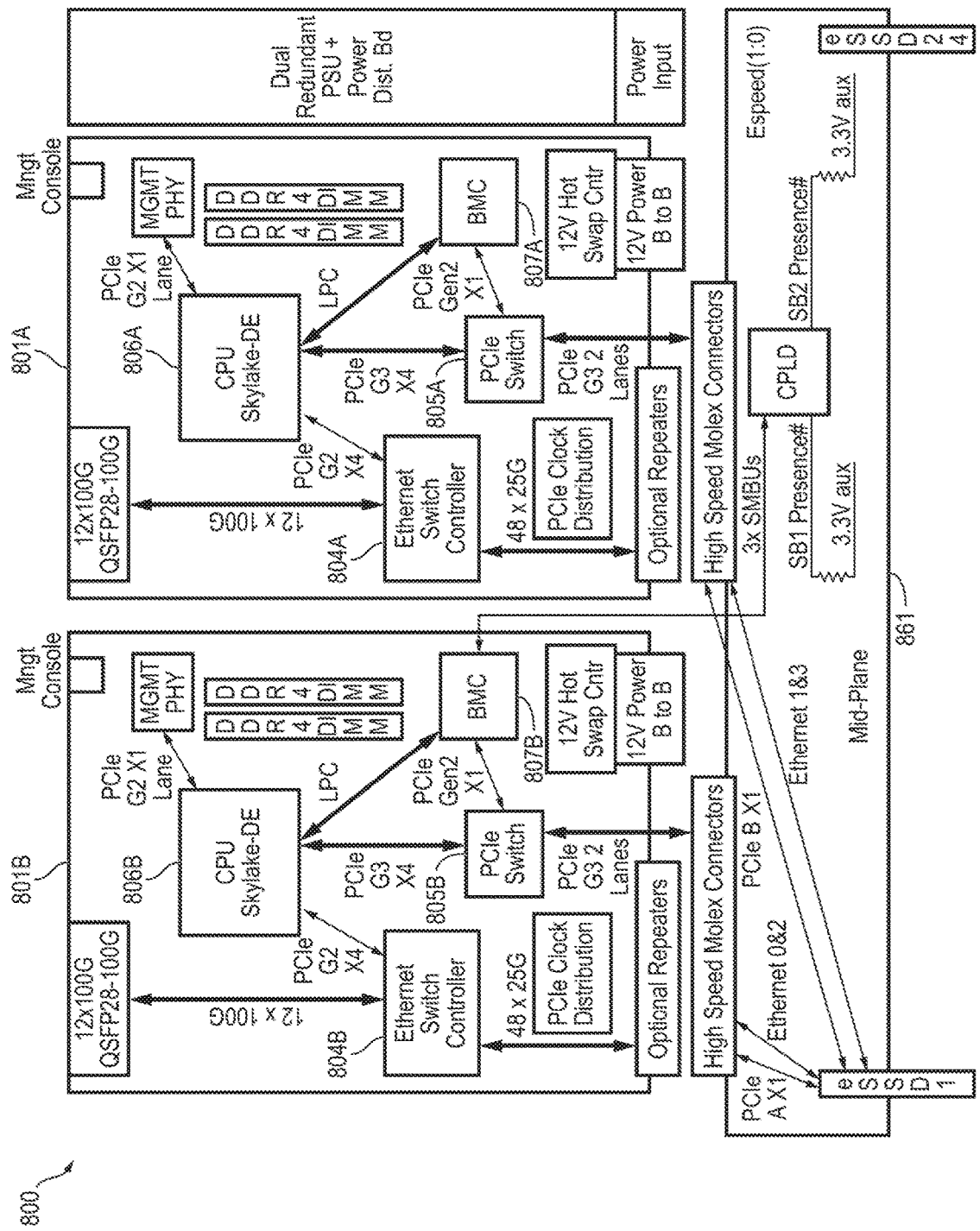
FIG. 8 illustrates a block diagram of an example switch, according to some example embodiments of the present invention.

FIG. 8 is a block diagram illustrating an example switch including two motherboards, according to one embodiment. The switch 800 includes two motherboards 801A and 801B to support multi I/O in a dual port configuration (in a HA mode) via a mid-plane 861. The motherboard 801A includes an Ethernet switch 804A and a PCIe switch 805A, and the motherboard 801B includes an Ethernet switch 804B and a PCIe switch 805B. Each of the motherboards 801A and 801B can include other components and modules, for example, a local CPU (806A, 806B), a BMC (807A, 807B), etc. as shown in the example motherboard 601 shown in FIG. 6A.

Several eSSDs can be plugged into device ports of the switch 800. For example, each of the eSSDs is connected to the switch 800 using a U.2 connector. Each eSSD can connect to both the motherboard 801A and the motherboard 801B. In the present example, the eSSDs plugged into the switch 800 are configured as an NVMe-oF device requiring connectivity to the switch 800 over the mid-plane 861 via the PCIe bus and Ethernet ports.

Figure 9:
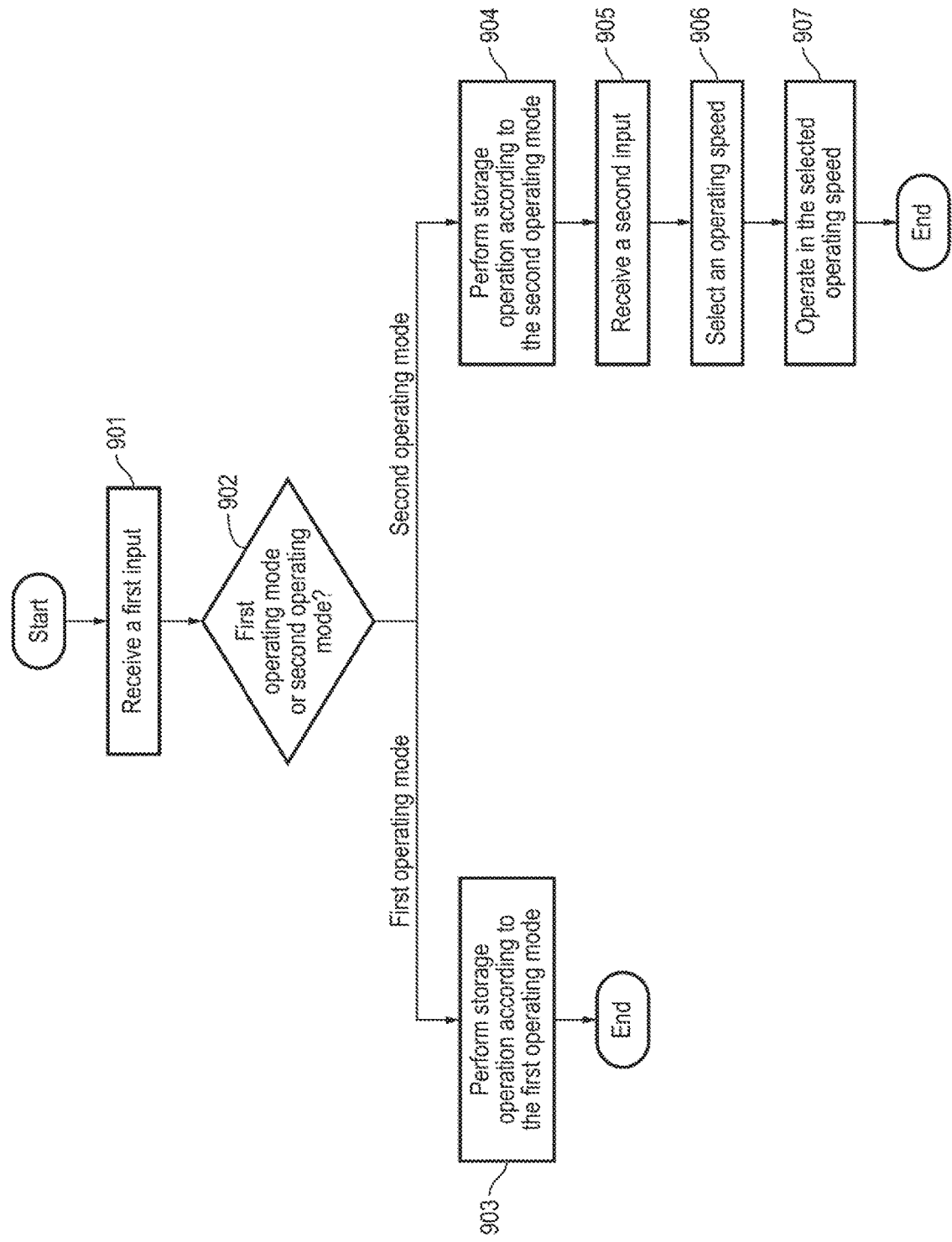
FIG. 9 illustrates a flow chart of a method for operating a storage device, according to some example embodiments of the present invention.

FIG. 9 is a flow chart of a method for operating a storage device, according to an embodiment of the present invention. The storage device may the NVMe-oF device 600 of FIG. 6A.

At 901, the storage device receives a first input. The storage device may receive the first input from a motherboard or a BMC via a plurality of device ports over a mid-plane. For example, the NVMe-oF device 600 may receive a first input from the motherboard 601 or BMC 632 via device ports 604-606 over a mid-plane 626 of FIG. 6A.

In one configuration, the first input may be controlled by using a physical pin on a chassis of the motherboard or by an in-band command from the BMC. For example, the first input received at the NVMe-oF device 600 may be controlled by using a physical pin (E6) on the chassis of the motherboard 601 of FIG. 6A.

At 902, based on the first input, the storage device determines whether to operate in a first operating mode or in a second operating mode. In one configuration, the first operating mode and the second operating mode of the storage device may be NVMe mode and NVMe-oF mode. For example, based on the first input, the NVMe-oF device 600 determines whether to operate in the NVMe mode or the NVMe-oF mode.

At 902, based on the first input, if the storage device determines to operate in the first operating mode, at 903, the storage device performs storage operations according to the first operating mode. For example, if based on the first input, the NVMe-oF device 600 determines to operate in the NVMe mode, the NVMe-oF device 600 performs storage operations according to the NVMe protocol.

However, if at 902, based on the first input, the storage device determines to operate in the second operating mode, at 904, the storage device performs storage operations according to the second operating mode. For example, if based on the first input, the NVMe-oF device 600 determines to operate in the NVMe-oF mode, the NVMe-oF device 600 performs storage operations according to the NVMe-oF protocol.

At 905, when operating in the second operating mode, the storage device receives a second input. The storage device may receive the second input from the mid-plane via the plurality of device ports. For example, while operating in the NVMe-oF mode, the NVMe-oF device 600 may receive a second input from the mid-plane 626 via the plurality of device ports 604-606 of FIG. 6A.

In one configuration, the second input is controlled by using two GPIO pins located on the mid-plane and controlled by the BMC or a local CPU of the motherboard, or one or more internal registers inside the FPGA of the storage device. For example, the second input may be controlled by using two GPIO pins (e.g., (ESpeed[1:0]) pins 402 of FIG. 4) located on the mid-plane 626 controlled by the BMC 632 or a local CPU 634 of the motherboard 601, or one or more internal registers inside the FPGA 602 of the NVMe-oF device 600 of FIG. 6A.

At 906, based on the second input, the storage device selects an operating speed from a plurality of operating speeds for the storage device. For example, based on the second input, the NVMe-oF device 600 of FIG. 6A selects an operating speed from a plurality of operating speeds for the storage device. For example, while operating in the NVMe-oF mode, based on the second input, the NVMe-oF device 600 of FIG. 6A selects an operating speed of 100 G or higher. In one configuration, the plurality of operating speeds of the storage device may be any number of speeds between 10 G and 100 G or higher.

At 907, while operating in the second mode, the storage device operates in the selected operating speed. For example, while operating in the NVMe-oF mode, the NVMe-oF device 600 of FIG. 6A operates in the operating speed of 100 G or higher.

Figure 10A:
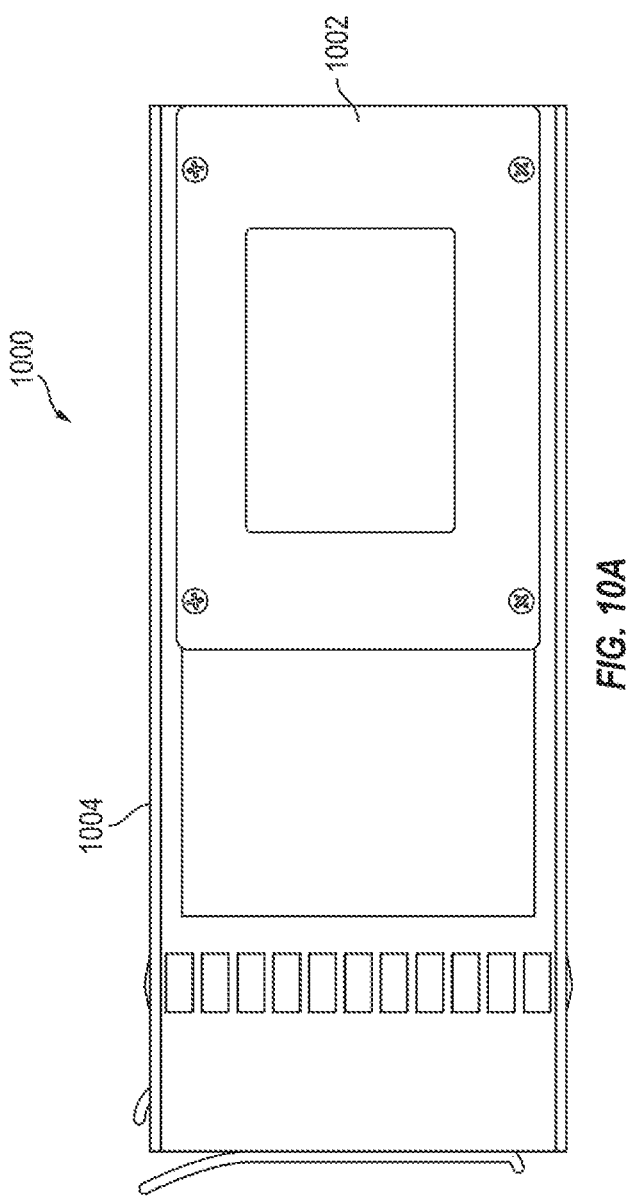

FIGS. 10A-10B illustrate a top view and a bottom view of an assembly 1000, respectively. The assembly includes a SFF SSD 1002 in a standard drive tray 1004. In an example, the length of the assembly 1000 may be 7" long. In one example, the length of the SFF SSD 1002 may be 5.75" or 146 mm and the SFF SSD 1002 may fit into a 2.5 inch SFF standard chassis, since the 2.5 inch SFF standard chassis offers a space for up to 5.75" long device.

In an example, the SFF SSD 1002 may be NF1 SSD 102 of FIG. 1. The length of the PCB (e.g., FPGA PCB 104) on which the SFF SSD 1002 may be mounted on, may be between 110 mm and 142.2 mm. Such length may enable the PCB on which the SFF SSD 1002 may be mounted on, to support a SFF-TA-1008 connector (in place of the U.2 connector 110) to connect the SFF SSD 1002 with a mid-plane via a SFF-TA-1002 connector, which may be connected to the mid-plane.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of" when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a multi-mode and/or multi-speed Non-volatile memory (NVM) express (NVMe) over fabrics (NVMe-oF) device have been specifically described and illustrated herein, many modifications and variations will be apparent to those skilled in the art. Accordingly, it is to be understood that a system and method for supporting multi-mode and/or multi-speed NVMe-oF devices constructed according to principles of this invention may be embodied other than as specifically described herein. The invention is also defined in the following claims, and equivalents thereof.

What is claimed is:

1. A device comprising:
   a printed circuit board (PCB);
   at least one solid state drive (SSD) connected at a first side of the PCB via at least one SSD connector;
   at least one field programmable gate array (FPGA) mounted on the PCB at a second side of the PCB, the second side of the PCB being different from the first side of the PCB; and
   at least one connector attached to the PCB, wherein the device is configured to operate in a first mode or a second mode based on a first input received via the at least one connector, wherein in the first mode the device is configured to operate in a first non-zero operating speed, and wherein in the second mode the device is configured to select a second non-zero operating speed from among a plurality of non-zero operating speeds available in the second mode based on a second input received via the at least one connector, wherein the first mode is a Non-volatile memory (NVM) express (NVMe) mode and the second mode is a NVMe over fabrics (NVMe-oF) mode.

2. The device of claim 1, wherein the at least one SSD comprises a first SSD and a second SSD and the at least one SSD connector comprises a first SSD connector and a second SSD connector, the first SSD being connected to the PCB at the first side of the PCB via the first SSD connector and the second SSD being connected to the PCB at the first side of the PCB via the second SSD connector, the first SSD and the second SSD each comprising a new form factor 1 (NF1) SSD, wherein the at least one connector comprises an U.2 connector and the first SSD connector and the second SSD connector each comprises a M.2 connector.

3. The device of claim 1, wherein the at least one SSD connector is electrically connected to the at least one SSD at a first side of the at least one SSD, the at least one SSD connector being attached to the PCB at the first side of the PCB and being positioned perpendicular with respect to the first side of the PCB.

4. The device of claim 1, further comprising a structural support located between the second side of the PCB and a second side of the at least one SSD, wherein the structural support comprises a support or standoff.

5. The device of claim 1, wherein a length of the at least one SSD is 110 mm and a length of the PCB is between 110 mm and 142 mm.

6. The device of claim 1, wherein a first side of the at least one FPGA is attached to the second side of the PCB, the at least one FPGA being electrically connected to the PCB.

7. The device of claim 6, further comprising a first interface layer attached at a third side of the at least one SSD and a second interface layer attached at a second side of the at least one FPGA, wherein the first interface layer and the second interface layer are used to transfer heat generated by the at least one SSD and the at least one FPGA to outside.

8. The device of claim 1, wherein the at least one connector comprises a SFF-TA-1008 connector.

9. The device of claim 1, wherein a length of the PCB is equal to or greater than a length of the at least one SSD.

10. The device of claim 1, wherein a length of the PCB is equal to or longer than a length of the at least one FPGA, the length of the at least one FPGA is 80 mm.

11. The device of claim 1, wherein the plurality of non-zero operating speeds of the device are two or more operating speeds at or greater than 10G.

12. The device of claim 1, wherein the first input is received from a mid-plane via the at least one connector, wherein the first input is controlled by using two general-purpose input/output (GPIO) pins controlled by a baseboard management controller (BMC) of a switch or a local central processing unit (CPU) of a motherboard, or one or more internal registers associated with the FPGA.

13. A system comprising:
   a first interface layer;
   at least one solid state drive (SSD) attached to the first interface layer at a first side of the at least one SSD;
   a printed circuit board (PCB) connected to the at least one SSD at a first side of the PCB via at least one SSD connector;
   at least one field programmable gate array (FPGA) mounted on the PCB at a second side of the PCB, wherein a first side of the FPGA is attached to the PCB, the second side of the PCB being different from the first side of the PCB;
   a second interface layer attached to the FPGA at a second side of the FPGA; and
   at least one connector attached to the PCB, wherein the system is configured to operate in a first mode or a second mode based on a first input received via the at least one connector, wherein in the first mode the system is configured to operate in a first non-zero operating speed, and wherein in the second mode the system is configured to select a second non-zero operating speed from among a plurality of non-zero operating speeds available in the second mode based on a second input received via the at least one connector, wherein the first mode is a Non-volatile memory (NVM) express (NVMe) mode and the second mode is a NVMe over fabrics (NVMe-oF) mode.

14. The system of claim 13, wherein the at least one connector is an U.2 connector or a SFF-TA-1008 connector and the at least one SSD connector is a M.2 connector, the at least one SSD connector being positioned perpendicular with respect to the first side of the PCB.

15. The system of claim 13, further comprising a structural support located between the second side of the PCB and a second side of the at least one SSD, wherein the structural support comprises a support or standoff.

16. The system of claim 13, wherein a length of the at least one SSD is 110 mm, a length of the PCB is between 110 mm and 142 mm, and a length of the at least one FPGA is 80 mm.

17. The system of claim 13, wherein a length of the PCB is equal to or greater than a length of the at least one SSD, and wherein the length of the PCB is equal to or greater than a length of the at least one FPGA.

18. A method comprising:
attaching a first interface layer at a first side of at least one solid state drive (SSD);
connecting the at least one SSD at a first side of a printed circuit board (PCB) via at least one SSD connector;
mounting at least one field programmable gate array (FPGA) on a second side of the PCB, wherein a first side of the FPGA is attached to the PCB, the second side of the PCB being different from the first side of the PCB;
attaching a second interface layer at a second side of the FPGA; and
attaching at least one connector to the PCB, wherein the at least one SSD is configured to operate in a first mode or a second mode based on a first input received via the at least one connector, wherein in the first mode the at least one SSD is configured to operate in a first non-zero operating speed, and wherein in the second mode the at least one SSD is configured to select a second non-zero operating speed from among a plurality of non-zero operating speeds available in the second mode based on a second input received via the at least one connector, wherein the first mode is a Non-volatile memory (NVM) express (NVMe) mode and the second mode is a NVMe over fabrics (NVMe-oF) mode.

19. The method of claim 18, further comprising incorporating a structural support between the second side of the PCB and a second side of the at least one SSD, wherein the structural support comprises a support or standoff and the at least one SSD connector is positioned perpendicular with respect to the first side of the PCB.

20. The method of claim 18, wherein a length of the PCB is equal to or greater than a length of the at least one SSD, and wherein the length of the PCB is equal to or greater than a length of the at least one FPGA.

* * * * *